(12) United States Patent
Saumagne

(10) Patent No.: US 11,126,095 B2
(45) Date of Patent: Sep. 21, 2021

(54) EXTREME ULTRAVIOLET LIGHT GENERATION DEVICE AND ELECTRONIC DEVICE MANUFACTURING METHOD

(71) Applicant: Gigaphoton Inc., Tochigi (JP)

(72) Inventor: Georg Saumagne, Oyama (JP)

(73) Assignee: Gigaphoton Inc., Tochigi (JP)

( * ) Notice: Subject to any disclaimer, the term of this patent is extended or adjusted under 35 U.S.C. 154(b) by 0 days.

(21) Appl. No.: 16/985,165

(22) Filed: Aug. 4, 2020

(65) Prior Publication Data

US 2021/0080842 A1 Mar. 18, 2021

(30) Foreign Application Priority Data

Sep. 13, 2019 (JP) .............................. JP2019-167115

(51) Int. Cl.
*G03F 7/20* (2006.01)
*H05G 2/00* (2006.01)

(52) U.S. Cl.
CPC ...... *G03F 7/70975* (2013.01); *G03F 7/70025* (2013.01); *G03F 7/70033* (2013.01); *G03F 7/70866* (2013.01); *G03F 7/70908* (2013.01); *H05G 2/008* (2013.01)

(58) Field of Classification Search
CPC ............. G03F 7/70025; G03F 7/70033; G03F 7/70175; G03F 7/70866; G03F 7/70908; G03F 7/70916; G03F 7/70975; H05G 2/003; H05G 2/008
See application file for complete search history.

(56) References Cited

U.S. PATENT DOCUMENTS

| 5,680,429 | A | 10/1997 | Hirose et al. |
| 7,251,012 | B2 | 7/2007 | Banine et al. |
| 8,399,867 | B2 | 3/2013 | Endo et al. |
| 2005/0167618 | A1 | 8/2005 | Hoshino et al. |
| 2006/0186356 | A1 | 8/2006 | Imai et al. |
| 2012/0205558 | A1* | 8/2012 | Jindal .................... B82Y 10/00 250/504 R |
| 2013/0077069 | A1* | 3/2013 | Mestrom ................ H05G 2/005 355/67 |
| 2016/0242268 | A1 | 8/2016 | McGeoch |

OTHER PUBLICATIONS

A Search Report issued by the Netherlands Patent Office on Mar. 9, 2021, which corresponds to Dutch Patent Application No. 2026231 and is related to U.S. Appl. No. 16/985,165; with partial English language explanation.

* cited by examiner

*Primary Examiner* — Peter B Kim
(74) *Attorney, Agent, or Firm* — Studebaker & Brackett PC

(57) ABSTRACT

An extreme ultraviolet light generation device according to an aspect of the present disclosure includes: a chamber; a mirror configured to condense extreme ultraviolet light radiated from plasma generated by irradiating a target supplied into the chamber with a laser beam; an electromagnet disposed outside the chamber to form a magnetic field between a generation region of the plasma in the chamber and the mirror; a current inversion device configured to invert the direction of current flowing through the electromagnet; and a controller configured to control the current inversion device to invert the direction of the current when a set condition is satisfied.

20 Claims, 17 Drawing Sheets

EXTREME ULTRAVIOLET LIGHT GENERATION DEVICE AND ELECTRONIC DEVICE MANUFACTURING METHOD

CROSS-REFERENCE TO RELATED APPLICATIONS

The present application claims the benefit of Japanese Patent Application No. 2019-167115, filed on Sep. 13, 2019, the entire contents of which are hereby incorporated by reference.

BACKGROUND

1. Technical Field

The present disclosure relates to an extreme ultraviolet light generation device and an electronic device manufacturing method.

2. Related Art

Recently, miniaturization of a transfer pattern in optical lithography of a semiconductor process has been rapidly proceeding along with miniaturization of the semiconductor process. Minute fabrication at 10 nm or smaller will be requested in the next generation technology. To meet the request for minute fabrication at 10 nm or smaller, for example, it is desired to develop a semiconductor exposure device including an extreme ultraviolet light generation device configured to generate extreme ultraviolet (EUV) light at a wavelength of 13 nm approximately in combination with reduced projection reflective optics.

Developed EUV light generation apparatuses include a laser produced plasma (LPP) device that uses plasma generated by irradiating a target substance with a pulse laser beam.

LIST OF DOCUMENTS

Patent Documents

Patent Document 1: U.S. Pat. No. 7,251,012
Patent Document 2: U.S. Pat. No. 5,680,429
Patent Document 3: U.S. Pat. No. 8,399,867

SUMMARY

An extreme ultraviolet light generation device according to an aspect of the present disclosure includes: a chamber; a mirror configured to condense extreme ultraviolet light radiated from plasma generated by irradiating a target supplied into the chamber with a laser beam; an electromagnet disposed outside the chamber to form a magnetic field between a generation region of the plasma in the chamber and the mirror; a current inversion device configured to invert the direction of current flowing through the electromagnet; and a controller configured to control the current inversion device to invert the direction of the current when a set condition is satisfied.

An electronic device manufacturing method according to another aspect of the present disclosure includes: generating extreme ultraviolet light by using an extreme ultraviolet light generation device including a chamber, a mirror configured to condense the extreme ultraviolet light radiated from plasma generated by irradiating a target supplied into the chamber with a laser beam, an electromagnet disposed outside the chamber to form a magnetic field between a generation region of the plasma in the chamber and the mirror, a current inversion device configured to invert the direction of current flowing through the electromagnet, and a controller configured to control the current inversion device to invert the direction of the current when a set condition is satisfied; outputting the extreme ultraviolet light to an exposure apparatus; and exposing a photosensitive substrate to the extreme ultraviolet light in the exposure apparatus to manufacture an electronic device.

BRIEF DESCRIPTION OF THE DRAWINGS

Embodiments of the present disclosure will be described below as examples with reference to the accompanying drawings.

DESCRIPTION OF EMBODIMENTS

Figure 1:
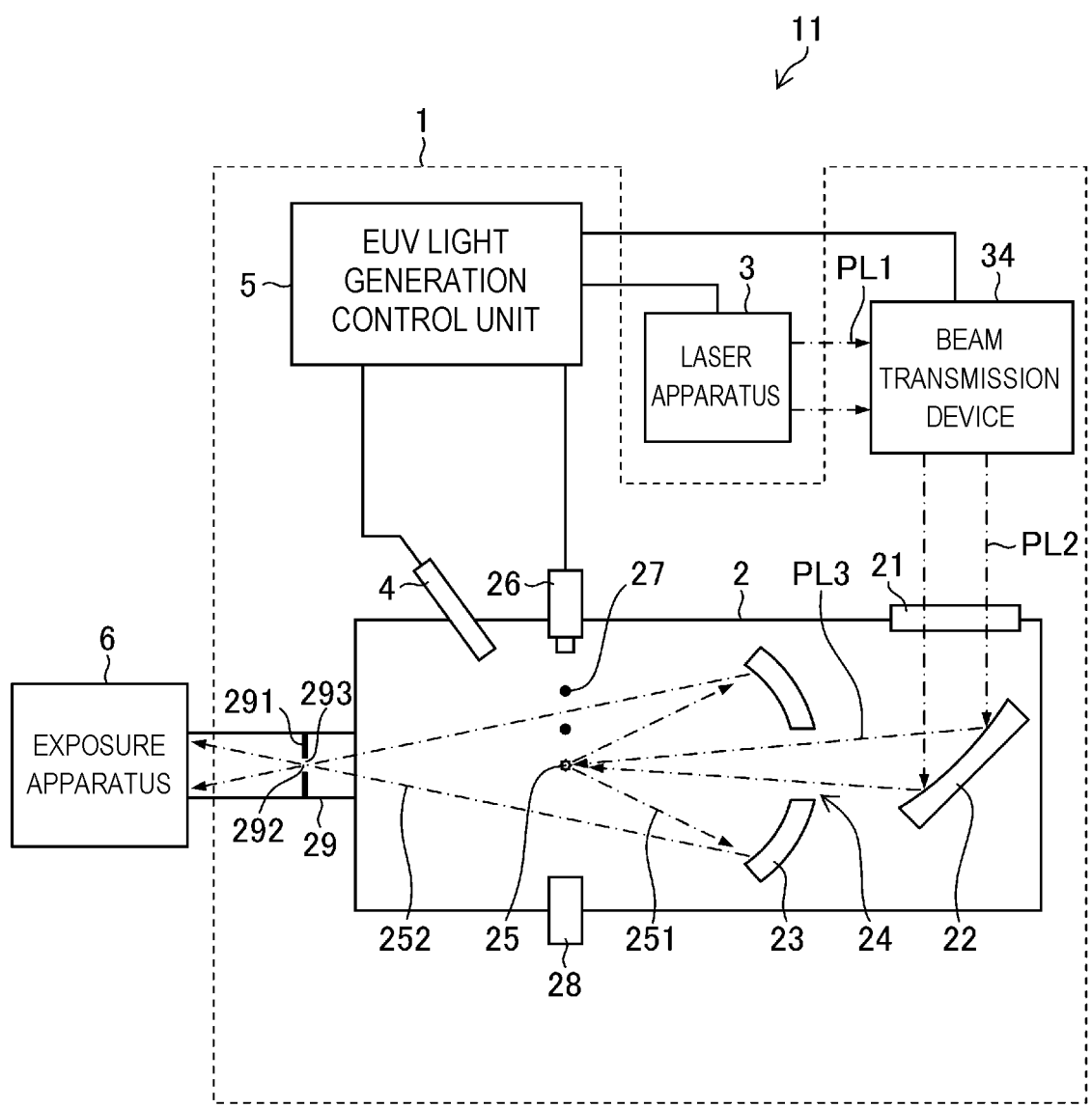
FIG. 1 schematically illustrates the configuration of an exemplary LPP EUV light generation system.

<Contents>
1. Terms
2. Overall description of EUV light generation system
   2.1 Configuration
   2.2 Operation
3. Description of EUV light generation apparatus according to comparative example
   3.1 Configuration
   3.2 Operation
   3.3 Effect
4. Problem
5. Embodiment 1
   5.1 Configuration
   5.2 Operation
   5.3 Effect
6. Specific example of current inversion control
   6.1 Main routine
   6.2 Exemplary control based on the number of shots
   6.3 Exemplary control based on EUV energy cumulated value
   6.4 Exemplary control based on symmetry evaluation value of far-field pattern
      6.4.1 Configuration for acquiring far-field pattern
      6.4.2 Operation
      6.4.3 Modification
      6.4.4 Control flow
   6.5 Example in which current direction is inverted when maintenance involving stop for defined time is performed
   6.6 Exemplary control based on combination of a plurality of conditions
   6.7 Other inversion conditions
7. Exemplary electronic device manufacturing method using EUV light generation apparatus Embodiments of the present disclosure will be described below in detail with reference to the accompanying drawings. The embodiments described below are examples of the present disclosure, and do not limit the contents of the present disclosure. Not all configurations and operations described in each embodiment are necessarily essential as configurations and operations of the present disclosure. Components identical to each other are denoted by an identical reference sign, and duplicate description thereof will be omitted.

1. Terms

"Target" is an object irradiated with a laser beam introduced into a chamber. When irradiated with the laser beam, the target generates plasma and radiates EUV light. The target is a plasma generation source.

"Droplet" is a form of the target supplied into the chamber. The droplet may be a guttate target formed into a substantially spherical shape by the surface tension of a target substance being melted.

"Plasma generation region" is a region in which plasma is generated in the chamber. The plasma generation region is a region in which the target supplied into the chamber is irradiated with a laser beam and plasma is generated from the target.

"Floating material" is a material floating in the chamber. The floating material may include at least one of debris generated when the target is irradiated with a laser beam, etching gas supplied into the chamber, and a reaction product of the debris and the etching gas.

"Debris" may include at least ions generated when the target is irradiated with a laser beam, atoms, ions neutralized through collision with the etching gas, fragments, and the like.

"Reaction product" may include at least one of a product generated through reaction of the ions and the etching gas, and a product generated through reaction of the etching gas with target atoms, fragments, the like.

"Pulse laser beam" may be a laser beam including a plurality of pulses.

"Laser beam" is not limited to a pulse laser beam but may be a general laser beam.

"Plasma light" is radiation light radiated from the target as plasma. This radiation light includes EUV light.

"EUV light" stands for "extreme ultraviolet light". "Extreme ultraviolet light generation device" is written as "EUV light generation apparatus".

2. Overall Description of EUV Light Generation System

2.1 Configuration

FIG. 1 schematically illustrates the configuration of an exemplary LPP EUV light generation system. This EUV light generation apparatus 1 is used together with at least one laser apparatus 3. Hereinafter, a system including the EUV light generation apparatus 1 and the laser apparatus 3 is referred to as an EUV light generation system 11.

The EUV light generation apparatus 1 includes a chamber 2 and a target supply unit 26. The chamber 2 is a sealable container. The target supply unit 26 supplies a target substance into the chamber 2 and is attached to, for example, penetrate through a wall of the chamber 2. The material of the target substance may contain tin, terbium, gadolinium, lithium, xenon, or a combination of two or more of these materials, but is not limited thereto.

The wall of the chamber 2 has at least one through-hole. The through-hole is blocked by a window 21 through which a pulse laser beam PL2 output from the laser apparatus 3 transmits. For example, an EUV condensation mirror 23 having a spheroidal reflective surface is disposed inside the chamber 2. The EUV condensation mirror 23 has a first focal point and a second focal point. For example, a multi-layer reflective film obtained by alternately stacking molybdenum and silicon is formed on the surface of the EUV condensation mirror 23. The EUV condensation mirror 23 is disposed so that, for example, the first focal point is positioned in a plasma generation region 25 and the second focal point is positioned at an intermediate focal point (IF) 292. The EUV condensation mirror 23 is provided with a through-hole 24 at a central part thereof through which a pulse laser beam PL3 passes.

The EUV light generation apparatus 1 includes a target sensor 4, an EUV light generation control unit 5 and the like. The target sensor 4 detects one or a plurality of the existence, trajectory, position, and speed of a target 27. The target sensor 4 may have an image capturing function.

In addition, the EUV light generation apparatus 1 includes a connection unit 29 that provides communication between the inside of the chamber 2 and the inside of an exposure apparatus 6. The connection unit 29 includes a wall 291 through which an aperture 293 is formed. The wall 291 is disposed so that the aperture 293 is positioned at the second focal point of the EUV condensation mirror 23.

In addition, the EUV light generation apparatus 1 includes a beam transmission device 34, a laser beam condensation mirror 22, and a target collection unit 28 or the like configured to collect the target 27. The beam transmission device 34 includes an optical element for defining the transmission state of a laser beam, and an actuator for adjusting the position, posture, and the like of the optical element. The target collection unit 28 is disposed on an extended line in a direction in which the target 27 output into the chamber 2 travels.

2.2 Operation

The following describes operation of the exemplary LPP EUV light generation system 11 with reference to FIG. 1. The inside of the chamber 2 is held at pressure lower than atmospheric pressure, and may be preferably vacuum. Alternatively, gas having a high transmittance for EUV light exists inside the chamber 2. The gas existing inside the chamber 2 may be, for example, hydrogen gas.

A pulse laser beam PL1 output from the laser apparatus 3 passes through the beam transmission device 34, transmits through the window 21 as the pulse laser beam PL2, and is incident in the chamber 2. The pulse laser beam PL2 travels inside the chamber 2 along at least one laser beam path and is reflected by the laser beam condensation mirror 22 and incident on at least one target 27 as the pulse laser beam PL3.

The target supply unit 26 outputs the target 27 formed of the target substance toward the plasma generation region 25 inside the chamber 2. The target supply unit 26 forms a droplet by, for example, a continuous jet scheme.

The target 27 is irradiated with at least one pulse included in the pulse laser beam PL3. Plasma is generated from the target 27 irradiated with the pulse laser beam PL3, and radiates a radiation light 251. EUV light 252 contained in the radiation light 251 is selectively reflected by the EUV condensation mirror 23. The EUV light 252 reflected by the EUV condensation mirror 23 is condensed at the intermediate focal point 292 and output to the exposure apparatus 6. One target 27 may be irradiated with a plurality of pulses included in the pulse laser beam PL3.

The EUV light generation control unit 5 collectively controls the entire EUV light generation system 11. The EUV light generation control unit 5 processes a result of detection by the target sensor 4. The EUV light generation control unit 5 controls the output timing of the target 27, the output direction of the target 27, and the like based on the result of detection by the target sensor 4. In addition, the EUV light generation control unit 5 controls the oscillation timing of the laser apparatus 3, the traveling direction of the pulse laser beam PL2, the focal position of the pulse laser beam PL3, and the like. The above-described various kinds of control are merely exemplary, and other control is added as necessary.

A control device such as the EUV light generation control unit 5 or a control unit of the exposure apparatus 6 may be achieved by hardware and software combination of one or a plurality of computers. The software is synonymous with a computer program. The computers conceptually include a programmable controller and a sequencer.

Functions of a plurality of control devices can be achieved by a single control device. In addition, in the present disclosure, the EUV light generation control unit 5, the control unit of the exposure apparatus 6, and the like may be connected with each other through a communication network such as a local area network or the Internet.

In a distributed computing environment, a computer program unit may be stored in local and remote memory storage devices.

3. Description of EUV Light Generation Apparatus According to Comparative Example

3.1 Configuration

Figure 2:
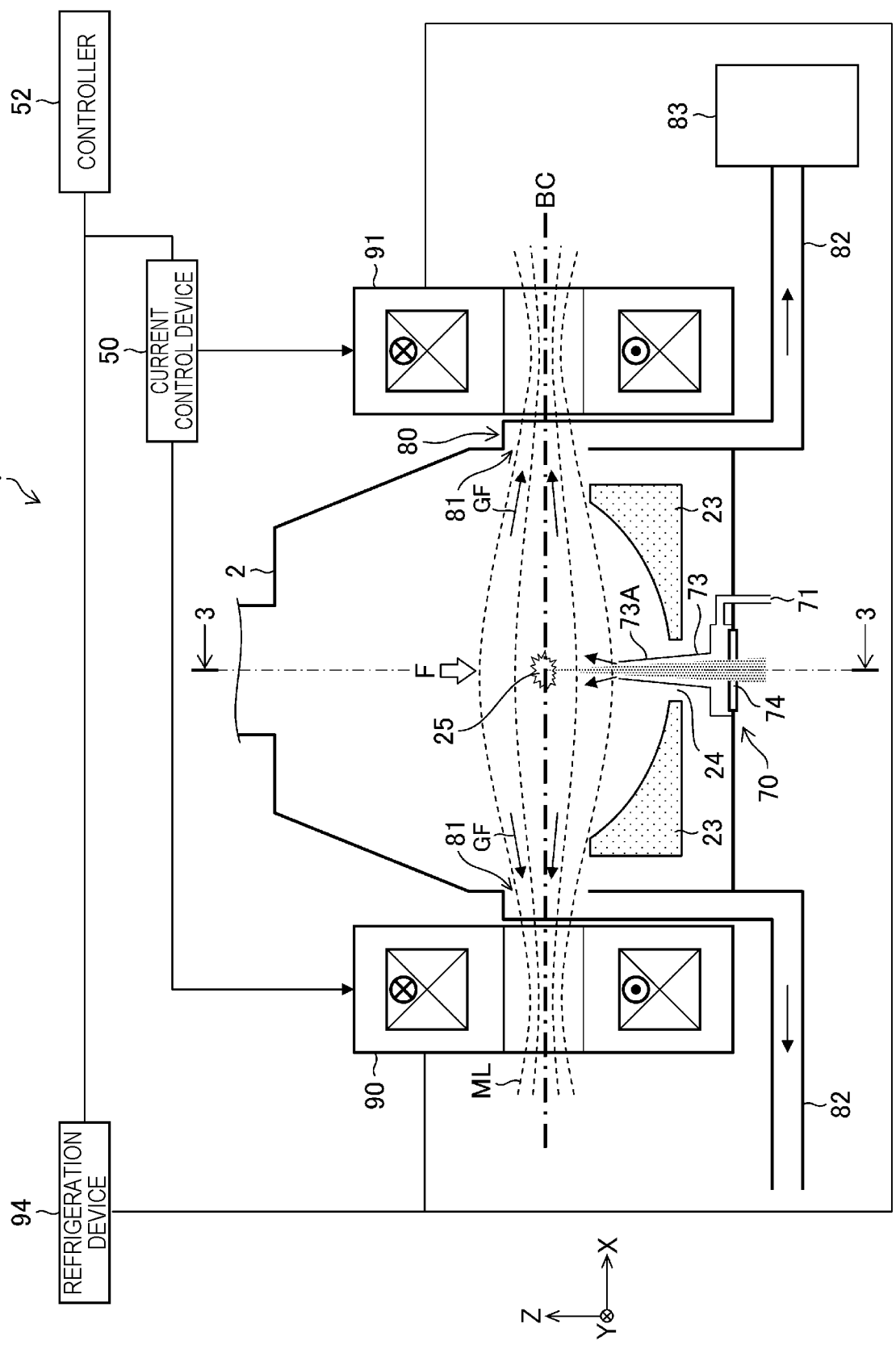
FIG. 2 is a cross-sectional view illustrating the configuration of an EUV light generation apparatus according to a comparative example.
Figure 3:
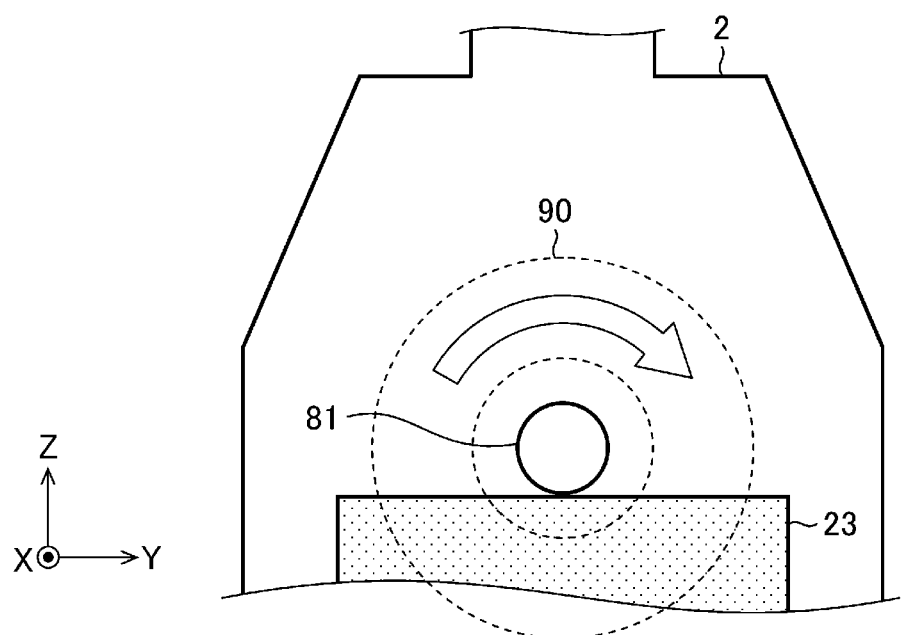
FIG. 3 is a cross-sectional view taken along line 3-3 in FIG. 2.

FIG. 2 is a cross-sectional view illustrating the configuration of the EUV light generation apparatus 1 according to a comparative example. FIG. 3 is a cross-sectional view taken along line 3-3 in FIG. 2.

In FIG. 2, a Z axis is defined to be an optical path axis passing through the first focal point and the second focal point (the intermediate focal point 292) of the EUV condensation mirror 23. The Z axial direction is a direction in which the EUV light 252 is output from the chamber 2 to the exposure apparatus 6. A Y axis is defined to be an axis passing through a nozzle hole of the target supply unit 26 and the plasma generation region 25. The Y axial direction is a direction in which the target supply unit 26 outputs the target 27 toward the plasma generation region 25, and is a direction orthogonal to the sheet of FIG. 2. The target 27 output from the target supply unit 26 travels from the front side toward the back side of the sheet of FIG. 2. An X axis is defined to be an axis orthogonal to the Y axis and the Z axis. The origin of the orthogonal coordinate system of the X axis, the Y axis, and the Z axis is defined to be at the first focal point of the EUV condensation mirror 23.

The chamber 2 includes a gas supply unit 70 and a discharge unit 80. The gas supply unit 70 includes a gas introduction port 71 and a gas supply cone 73. One end of the gas introduction port 71 is connected with an etching gas supply source (not illustrated). The other end of the gas introduction port 71 is communicated with the inside of the gas supply cone 73.

The gas supply cone 73 has a holder configuration surrounding and holding an entrance window 74 through which a laser beam transmits. The entrance window 74 may be the window 21 described with reference to FIG. 1. The gas supply cone 73 has a cone opening 73A protruding from the through-hole 24 of the EUV condensation mirror 23. The cone opening 73A is opened toward the plasma generation region 25.

Two coil electromagnets 90 and 91 are disposed outside the chamber 2. The electromagnets 90 and 91 may each be formed by winding a coil around a torus core. The electromagnets 90 and 91 are oppositely disposed to generate a mirror magnetic field with the plasma generation region 25 interposed therebetween. The central axis of the magnetic field formed by the electromagnets 90 and 91 is referred to as a magnetic field central axis BC. The magnetic field central axis BC may be the X axis. The electromagnets 90 and 91 may be, for example, superconductive magnets. When the electromagnets 90 and 91 are superconductive magnets, the electromagnets 90 and 91 are cooled by a refrigeration device 94. The refrigeration device 94 may be a refrigerant circulation device configured to supply low-temperature refrigerant to the electromagnets 90 and 91.

The discharge unit 80 includes a discharge port 81, a discharge pipe 82, and a discharge device 83. The discharge port 81 is an opening provided to the inner wall surface of the chamber 2 and provided at a position where the magnetic field central axis BC traverses the inner wall of the chamber 2. The magnetic field central axis BC traverses the inner wall of the chamber 2 at two positions. The discharge port 81 is provided near a position where the magnetic field converges. The opening area of the discharge port 81 is larger than the ion convergence radius. The opening shape of the discharge port 81 may be circular as illustrated in FIG. 3 or may be another shape.

The discharge pipe 82 is disposed between the chamber 2 and each of the electromagnets 90 and 91. The discharge pipe 82 is connected with the discharge port 81 and the discharge device 83. The chamber 2 is connected with the discharge device 83 through the discharge port 81 and the discharge pipe 82.

The discharge device 83 discharges gas in the chamber 2 through suction operation. Specifically, the discharge device 83 sucks the gas in the chamber 2 and discharges a floating material contained in the gas to the outside of the chamber 2. Through the suction operation of the discharge device 83, the discharge pipe 82 causes the gas in the chamber 2 to flow to the discharge device 83 and discharges a floating material P contained in the gas to the discharge device 83.

A fine particle trapping (not illustrated) may be included in at least one of the discharge pipe 82 and the discharge device 83. In addition, a detoxification device (not illustrated) is provided at an end part of the discharge device 83.

The EUV light generation apparatus 1 includes a current control device 50 and a controller 52. The current control device 50 controls current flowing through the electromagnets 90 and 91 to a predetermined current value. The current control device 50 causes current having the predetermined value to flow, for example, in a direction (clockwise direction in FIG. 3) indicated by the white arrow in FIG. 3. The current flowing through the electromagnets 90 and 91 is direct current. Each symbol of a circle surrounding a black dot in FIG. 2 indicates that current flows from the back side toward the front side of the sheet. Each symbol of a circle surrounding "X" in FIG. 2 indicates that current flows from the front side toward the back side of the sheet.

The controller 52 controls the current control device 50 and the refrigeration device 94. The controller 52 may control other operation of the EUV light generation apparatus 1 such as operation of the laser apparatus 3 and the discharge device 83.

In other words, the controller 52 may be part or the entire of the EUV light generation control unit 5.

3.2 Operation

The following describes operation of the EUV light generation apparatus 1 illustrated in FIGS. 2 and 3. The electromagnets 90 and 91 form a mirror magnetic field around the plasma generation region 25 in the chamber 2. Magnetic field lines ML of the magnetic field formed by the electromagnets 90 and 91 converge near the electromagnets 90 and 91.

Ions scattering from plasma in the chamber 2 travel along the magnetic field lines ML while performing helical motion due to the Lorentz force, and are decelerated and neutralized by the etching gas in the chamber 2 to become fine particle debris.

The gas supply unit 70 supplies the etching gas into the chamber 2 through the gas introduction port 71. Part of the etching gas passes inside the gas supply cone 73 through the gas introduction port 71 and is supplied into the chamber 2. The amount of motion of the etching gas supplied from the gas supply cone 73 prevents debris and the like scattering from the plasma generation region 25 from adhering to the entrance window 74. In addition, debris adhering to the entrance window 74 reacts with the etching gas and generates a reaction product of gas at room temperature. Part of the etching gas reacts with debris adhering to a reflective surface of the EUV condensation mirror 23 and generates a reaction product of gas at room temperature. For example, when the target substance is Sn (tin) and the etching gas is $H_2$ (hydrogen), the reaction product is $SnH_4$ (stannane). $SnH_4$ is gas at room temperature and thus can be discharged through the discharge port 81.

The etching gas supplied from the gas supply unit 70 to the chamber 2 and gas containing the reaction product are discharged from the chamber 2 through the discharge port 81.

The fine particle debris is discharged out of the chamber 2 through the discharge port 81 and the discharge pipe 82 by gas flow GF toward the discharge port 81. Ions may be neutralized in the discharge pipe 82.

The discharge unit 80 discharges the etching gas not subjected to reaction with the debris in the chamber 2 and the reaction product of the debris and the etching gas out of the chamber 2 through the discharge port 81, the discharge pipe 82, and the discharge device 83. The discharge unit 80 is adjusted to perform the discharge at a flow rate equal to the mass flow rate of the etching gas supplied by the gas supply unit 70. In addition, the supply amount and discharge amount of the gas may be controlled by a control device (not illustrated) to maintain the internal pressure of the chamber 2 substantially constant.

A typical operation condition of the EUV light generation apparatus 1 is as follows. The magnetic field intensity in the chamber 2 is 0.4 T to 3 T, preferably 0.5 T to 1.5 T. The flow rate of the etching gas introduced into the chamber 2 is 5 slm to 100 slm in total, preferably 10 slm to 30 slm. In addition to the gas introduction port 71, the chamber 2 introduces the etching gas into a gas lock mechanism for protecting, for example, various sensors and monitoring windows in some cases. Thus, the etching gas introduced through the gas introduction port 71 may be determined in the above-described total amount range with the flow rate of the gas lock mechanism taken into account. The gas pressure in the chamber 2 is 10 Pa to 100 Pa, preferably 15 Pa to 40 Pa.

The EUV light generation apparatus 1 may include an appropriate temperature adjustment device (not illustrated) to maintain the temperature of the EUV condensation mirror 23 at 60° C. or lower. The temperature of the EUV condensation mirror 23 is preferably adjusted to 20° C. or lower.

3.3 Effect

With the EUV light generation apparatus 1 according to the comparative example illustrated in FIGS. 2 and 3, the fine particle debris does not accumulate in the chamber 2 and is discharged out of the chamber 2 through the discharge port 81. Accordingly, the fine particle debris can be prevented from diffusing and adhering to the EUV condensation mirror 23. Thus, decrease of the reflectance of the EUV condensation mirror 23 can be reduced, which leads to decrease of the frequency of replacement of the EUV condensation mirror 23 and hence to lower operation cost of the EUV light generation apparatus 1.

4. Problem

Figure 4:
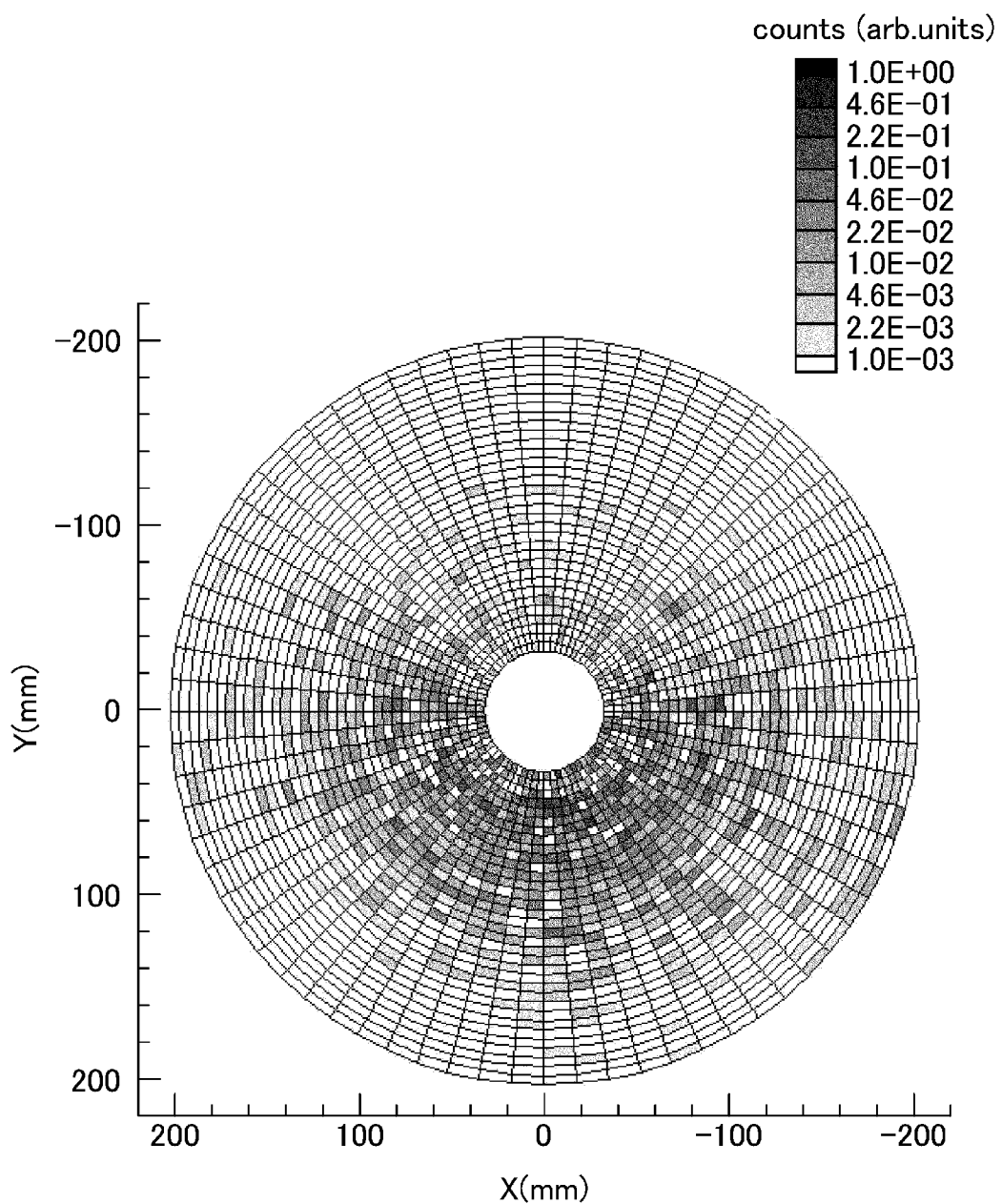
FIG. 4 illustrates a simulation result of ion distribution on a surface of an EUV condensation mirror when the surface is viewed in the direction of Arrow F in FIG. 2.

FIG. 4 illustrates a simulation result of ion distribution on the surface of the EUV condensation mirror 23 when the surface is viewed in the direction of Arrow F in FIG. 2. In FIG. 4, a site where the number of ions is larger is illustrated at higher density. A situation as follows is inferred from FIG. 4.

(1) Some of ions generated along with plasma generation reach the surface of the EUV condensation mirror 23 without reaching the discharge port 81 due to high energy.

(2) The ions reach on the surface of the EUV condensation mirror 23 at asymmetric sites through helical motion due to the magnetic field. In other words, in FIG. 4, the ion reaching sites tend to concentrate in a reflective surface region on the lower side of a mirror central position (Y=0) in the Y axial direction.

(3) It is expected that the reflectance at the ion reaching sites decreases along with ion collision over a long period. Thus, it is understood that the ion distribution illustrated in FIG. 4 corresponds to reflectance distribution of the EUV condensation mirror 23.

The above discussion indicates that symmetry of a condensation pattern (far-field pattern) by the EUV condensation mirror 23 degrades due to the ions reaching the surface of the EUV condensation mirror 23 and exposure performance of the exposure apparatus 6 potentially cannot be maintained.

5. Embodiment 1

5.1 Configuration

Figure 5:
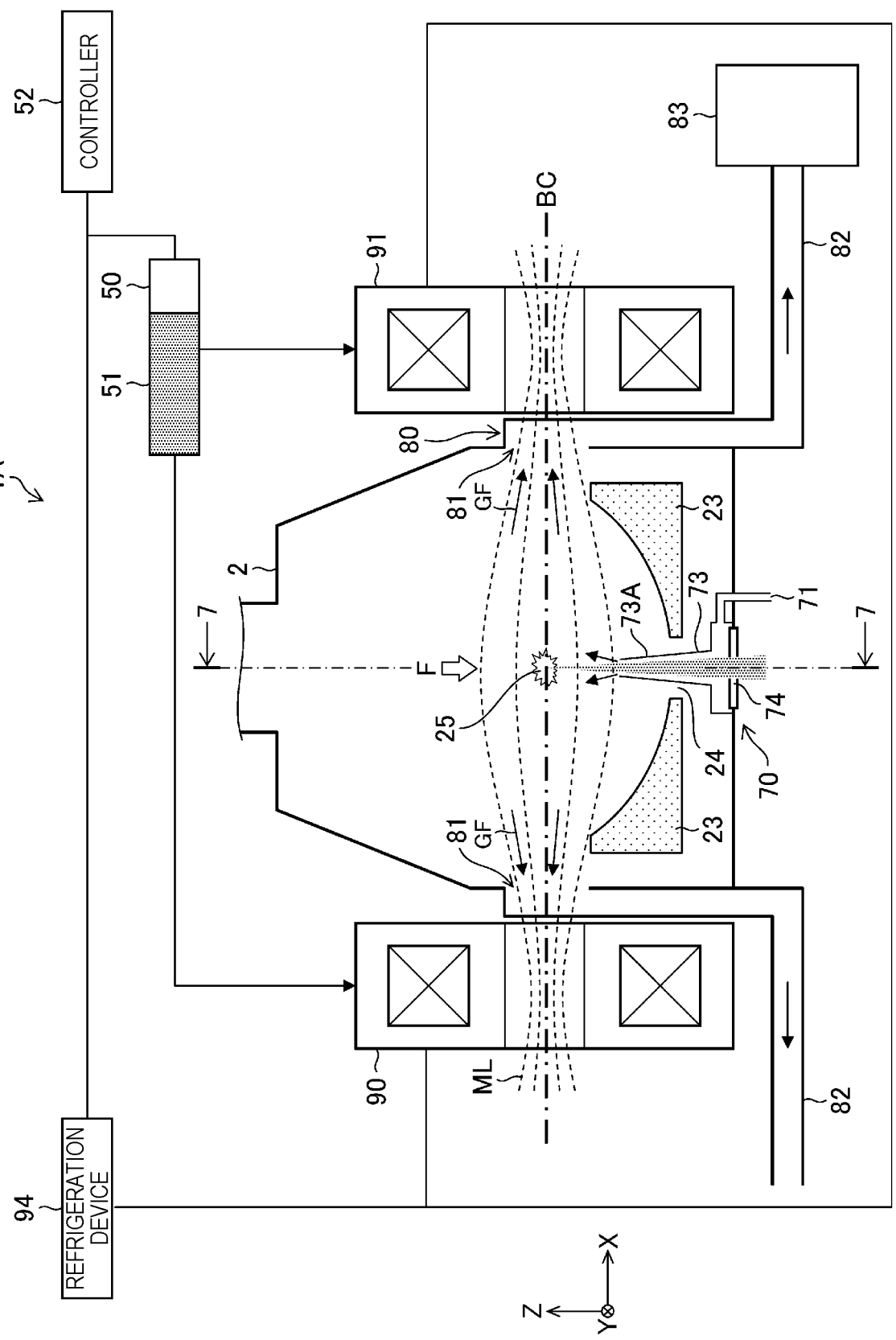
FIG. 5 schematically illustrates the configuration of an EUV light generation apparatus according to Embodiment 1.

FIG. 5 schematically illustrates the configuration of an EUV light generation apparatus 1A according to Embodiment 1. In the configuration of the EUV light generation apparatus 1A according to Embodiment 1, a component same as that of the EUV light generation apparatus 1 of the comparative example is denoted by an identical reference sign, and description thereof will be omitted. The following describes difference of the EUV light generation apparatus 1A illustrated in FIG. 5 from the EUV light generation apparatus 1 illustrated in FIG. 2.

The current control device 50 of the EUV light generation apparatus 1A according to Embodiment 1 includes a current inversion device 51 configured to invert the direction of current flowing through the electromagnets 90 and 91. "The direction of current" is synonymous with "the orientation of current", and "inversion" is synonymous with "switching to the opposite orientation (opposite direction)".

The current inversion device 51 includes, for example, a plurality of diodes (not illustrated) and a plurality of switching elements (not illustrated). Each switching element may be a gate turn-off thyristor (GTO) or a thyristor of SiC (silicon carbide) or the like. Alternatively, the current inversion device 51 may be constituted by an electromagnetic switch. The current inversion device 51 may be configured to switch the orientation of current supplied from a current source to a direction (first direction) and a direction (second direction) opposite thereto.

The controller 52 senses event information and controls the current control device 50 and the refrigeration device 94. The event information includes information used to determine whether to invert the direction of current flowing through the electromagnets 90 and 91. The event information is input through an input operation by an operator using a user interface (not illustrated) in some cases, depending on the kind of the information. Alternatively, the event information may be acquired from a sensor included in the EUV light generation apparatus 1A, and the event information related to date and time may be acquired from a clock, a timer, a counter built in the controller 52, or a combination of these devices.

5.2 Operation

Figure 6:
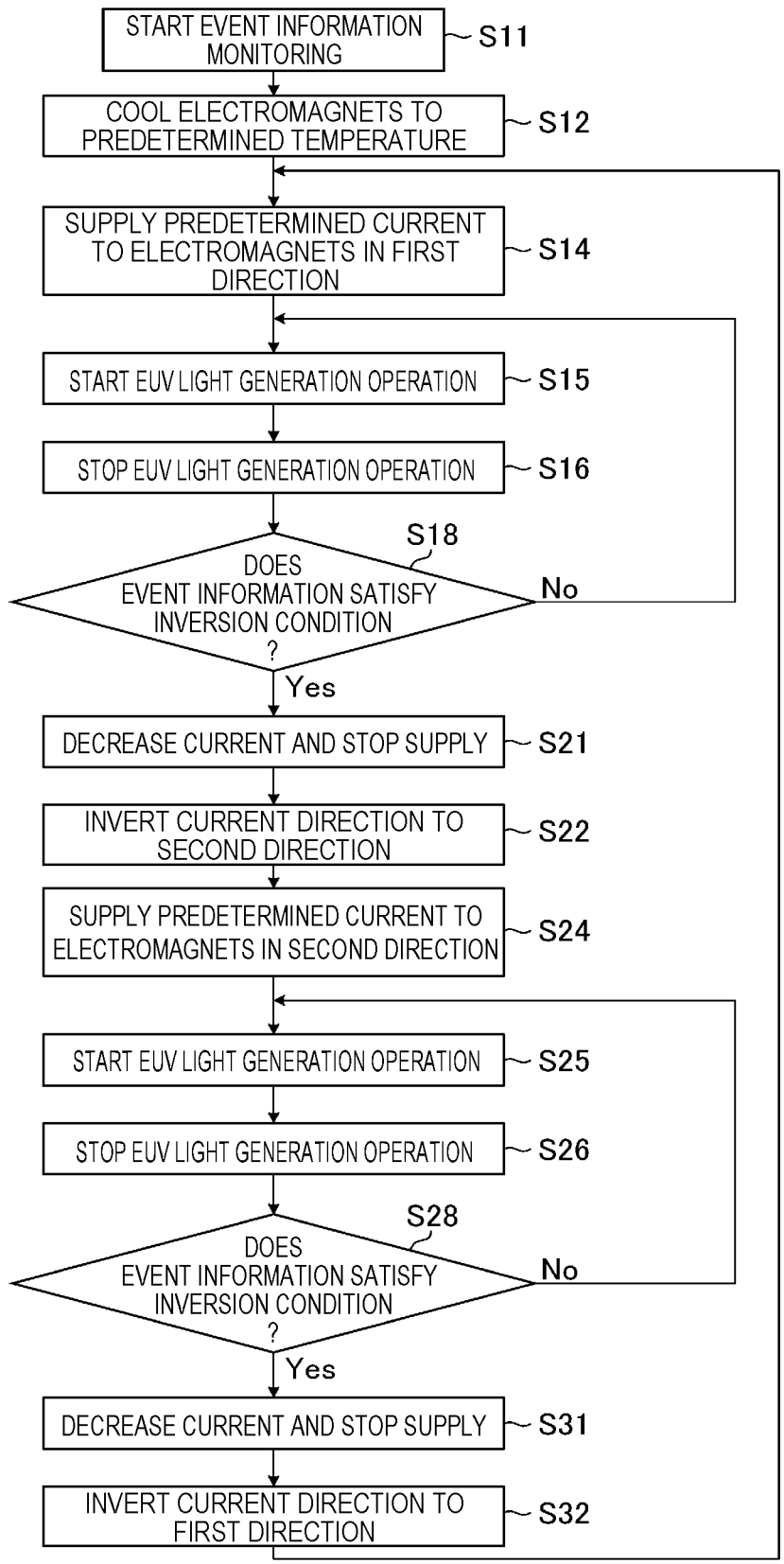
FIG. 6 is a flowchart illustrating exemplary control by a controller of the EUV light generation apparatus according to Embodiment 1.

The following describes the operation of the EUV light generation apparatus 1A according to Embodiment 1. FIG. 6 is a flowchart illustrating exemplary control by the controller 52 of the EUV light generation apparatus 1A. Each step in FIG. 6 may be performed by a CPU included in the controller 52 through execution of a computer program.

At step S11, the controller 52 starts monitoring of the event information. The event information may be, for example, information of maintenance performed, the number of shots of EUV light, an EUV energy cumulated value, an elapsed time since the previous maintenance, an elapsed time since the start of use of the EUV light generation apparatus 1A after installation, or a combination of these pieces of information. "Maintenance" may be, for example, maintenance requiring a work time equal to or longer than a defined time. The defined time may be, for example, one hour. Specific examples of maintenance requiring a work time equal to or longer than one hour include replacement of a droplet generator used at the target supply unit 26 and replacement of an EUV sensor.

The EUV energy cumulated value is the cumulated value of a parameter reflecting the energy of EUV light generated by the EUV light generation apparatus 1A. For example, the EUV energy cumulated value is the cumulated value of a measured energy value of EUV light reflected by the EUV condensation mirror 23 in a far field, or an energy cumulated value acquired based on profile data of the far field. The profile data of the far field reflects energy distribution at a light beam section of EUV light reflected by the EUV condensation mirror 23. The controller 52 receives the measured energy value and the profile data from a sensor (not illustrated) and calculates the EUV energy cumulated value.

At step S12, the controller 52 controls the refrigeration device 94 to cool the electromagnets 90 and 91 to a predetermined temperature.

Figure 7:
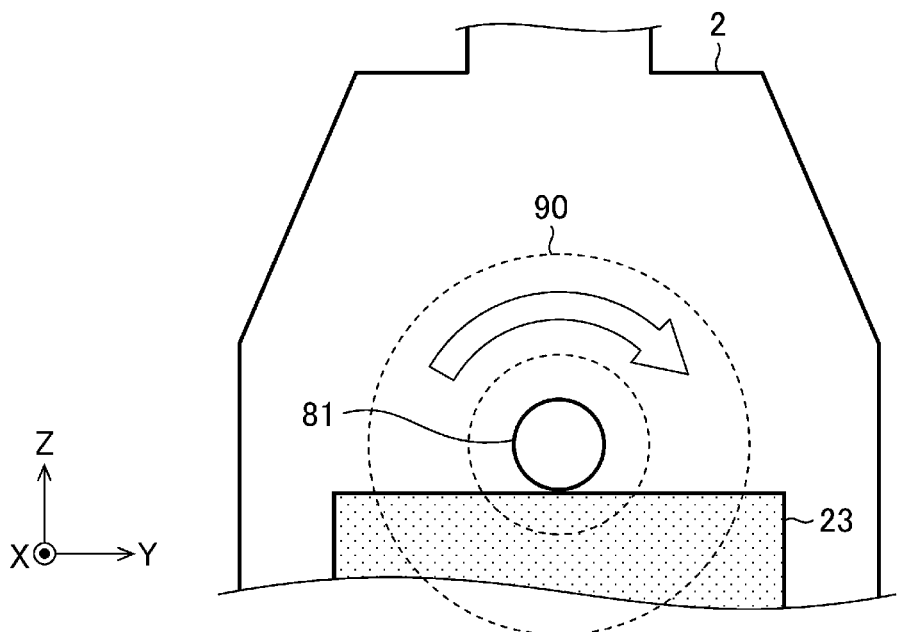
FIG. 7 is a cross-sectional view taken along line 7-7 in FIG. 5, illustrating a case in which the direction of current is a first direction.

At step S14, the controller 52 controls the current control device 50 to supply predetermined current to the electromagnets 90 and 91 in the first direction. The first direction may be, for example, a current direction indicated by the white arrow in FIG. 7. FIG. 7 is a cross-sectional view taken along line 7-7 in FIG. 5. The current flows through the electromagnets 90 and 91 in directions identical to each other.

At step S15 after a stable magnetic field is formed in the chamber 2, the controller 52 starts EUV light generation operation. The controller 52 may generate EUV light through a burst operation in accordance with a command from the exposure apparatus 6. Accordingly, EUV light is generated and supplied from the EUV light generation apparatus 1A to the exposure apparatus 6. Thereafter at step S16, the controller 52 stops the EUV light generation operation in accordance with a command from the exposure apparatus 6.

At step S18 after step S16, the controller 52 determines whether the event information satisfies an inversion condition. The inversion condition is a condition for inverting the direction of current flowing through the electromagnets 90 and 91. The inversion condition may be such that, for example, the timing of performing maintenance involving stop equal to or longer than the defined time has been reached, the number of times of maintenance performed has reached a defined number of times, the number of shots has reached a defined number of shots, the EUV energy cumulated value has reached a defined energy cumulated value, or an elapsed time since maintenance performed or an elapsed time since installation of the EUV light generation apparatus 1A has exceeded a defined elapsed time. Alternatively, the inversion condition may be "AND (logic product)" or "OR (logical sum)" of these exemplary conditions. Alternatively, the inversion condition may be simply based on determination of whether maintenance has been performed.

The "timing of performing maintenance" conceptually includes at least one of the timing of scheduled maintenance, the timing at which maintenance work is started, and the timing at which maintenance work is being performed.

The inversion condition may be based on determination of whether an index value based on a function of an elapsed time until maintenance involving stop equal to or longer than the defined time is performed since the start of the operation of the EUV light generation apparatus 1A while current flows in a particular current direction, and a parameter, such as the number of shots or the energy cumulated value, correlated with reflectance distribution asymmetry due to degradation of the EUV condensation mirror 23 satisfies a determination reference value. Reference values for condition determination, such as the "defined number of times", the "defined number of shots", the "defined energy cumulated value", the "defined elapsed time", and the "determination reference value" may be each a fixed value set in advance or may be adaptively updated. The inversion condition is an exemplary "set condition" in the present disclosure.

When the result of the determination at step S18 is negative, the controller 52 returns to step S15. When the result of the determination at step S18 is positive, in other words, when the inversion condition is satisfied, the controller 52 proceeds to step S21. In addition, the controller 52 may reset the event information when the inversion condition is satisfied.

At step S21, the controller 52 decreases current flowing through the electromagnets 90 and 91 and stops current supply.

Thereafter at step S22, the controller 52 causes the current inversion device 51 to invert the direction of current to the second direction.

Figure 8:
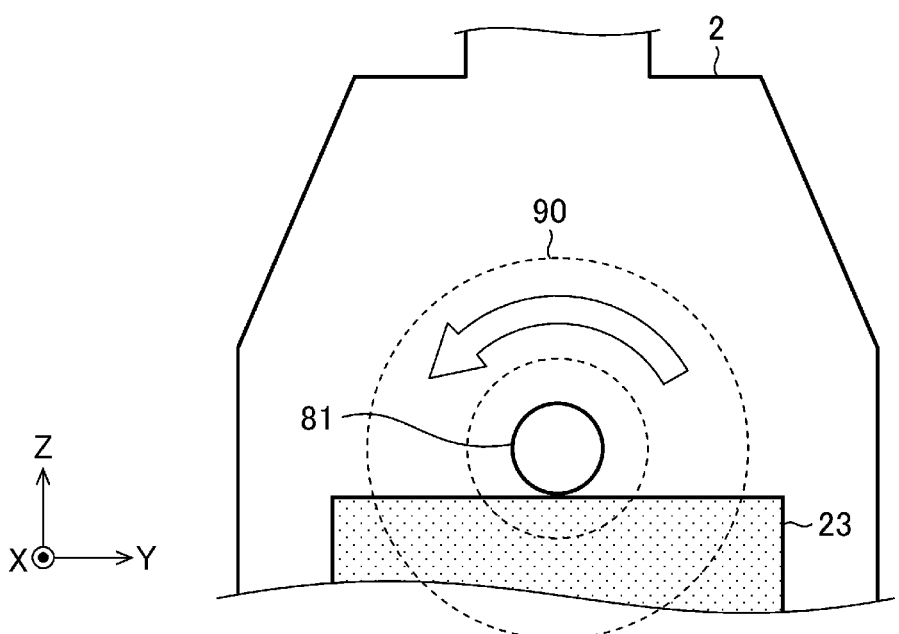
FIG. 8 is a cross-sectional view replacing FIG. 7 when the direction of current is inverted in the configuration illustrated in FIG. 5, illustrating a case in which the direction of current is a second direction.

At step S24, the controller 52 supplies predetermined current to the electromagnets 90 and 91 in the second direction. The second direction may be, for example, a current direction indicated by the white arrow in FIG. 8. FIG. 8 is a cross-sectional view replacing FIG. 7 when the direction of current is inverted in the configuration illustrated in FIG. 5.

After step S24 in FIG. 6, the controller 52 proceeds to step S25 and starts EUV light generation operation. Accordingly, EUV light is generated and supplied from the EUV light generation apparatus 1A to the exposure apparatus 6. Thereafter at step S26, the controller 52 stops the EUV light generation operation. Steps S25 and S26 may be same as steps S15 and S16.

At step S28 after step S26, the controller 52 determines whether the event information has satisfied the inversion condition. Step S28 may be same as step S18. When the result of the determination at step S28 is negative, the controller 52 returns to step S25. When the result of the determination at step S28 is positive, in other words, when the inversion condition is satisfied, the controller 52 proceeds to step S31.

At step S31, the controller 52 decreases current flowing through the electromagnets 90 and 91 and stops current supply.

Thereafter at step S32, the controller 52 causes the current inversion device 51 to invert the direction of current to the first direction.

After step S32, the controller 52 returns to step S14. Thereafter, the above-described operation is repeated.

5.3 Effect

In the EUV light generation apparatus 1A according to Embodiment 1, the controller 52 inverts the direction of current flowing through the electromagnets 90 and 91 each time the event information satisfies the inversion condition.

Figure 9:
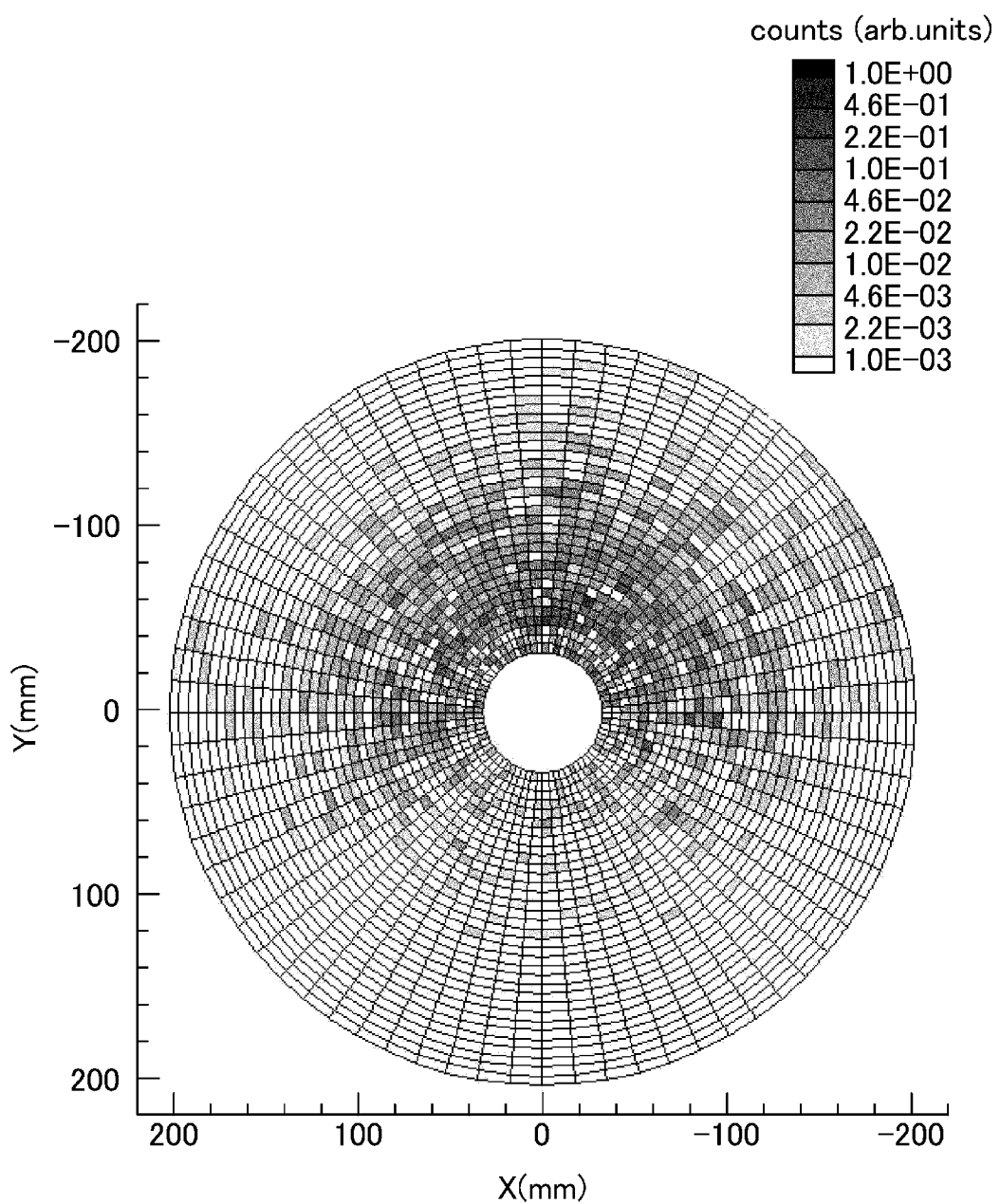
FIG. 9 illustrates a simulation result of ion distribution on the surface of the EUV condensation mirror when the surface is viewed in the direction of Arrow F in FIG. 5 while the direction of current is the second direction.

FIG. 9 illustrates a simulation result of ion distribution on the surface of the EUV condensation mirror 23 when the surface is viewed in the direction of Arrow F in FIG. 5 while the direction of current is the second direction. When current flows in the second direction opposite to the first direction, ion distribution as illustrated in FIG. 9 is obtained. In the ion distribution illustrated in FIG. 9, ion reaching sites tend to concentrate in a reflective surface region on the upper side of the mirror central position (Y=0) in the Y axial direction.

Figure 10:
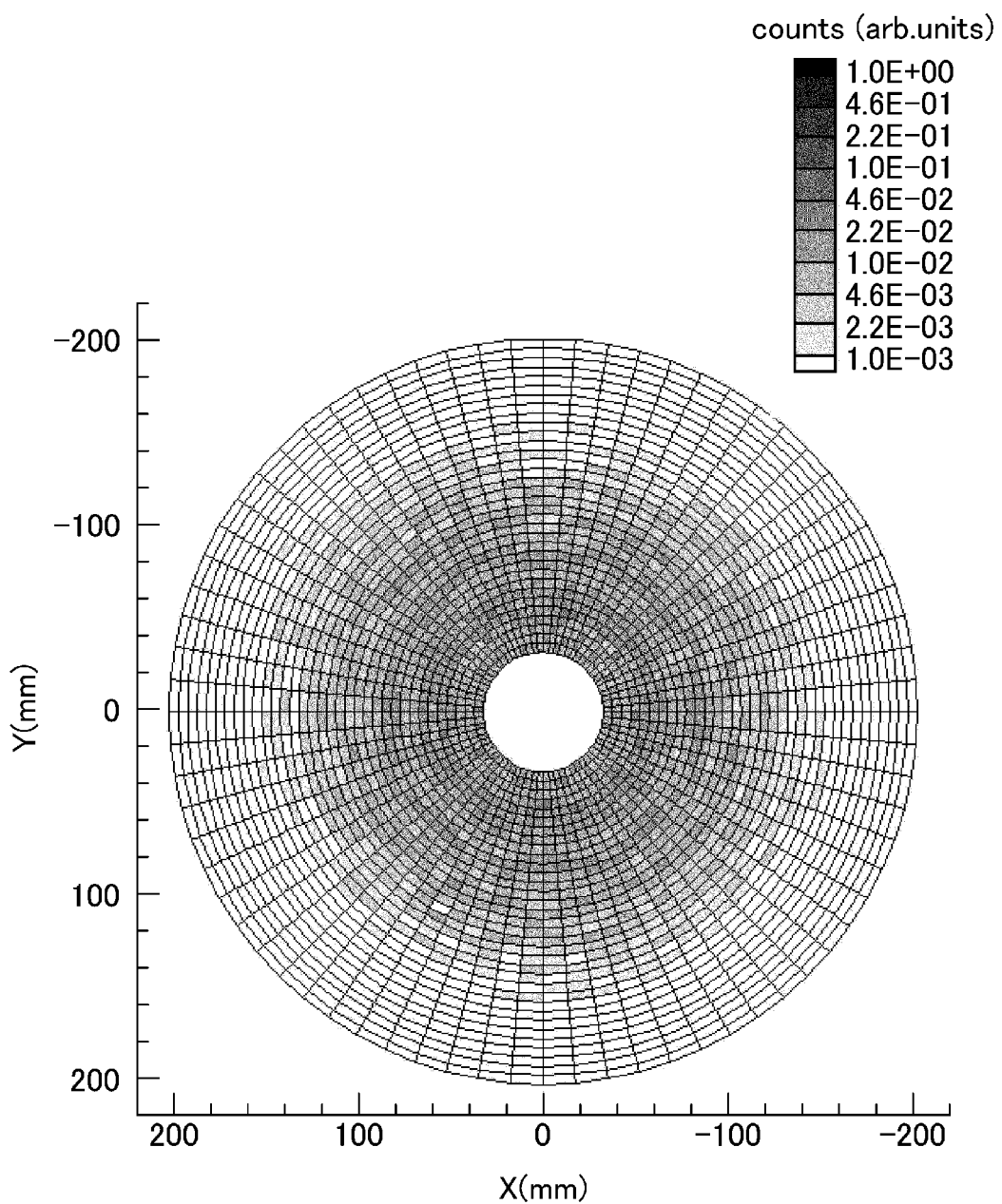
FIG. 10 illustrates a simulation result of ion distribution obtained by superimposing the ion distribution illustrated in FIG. 4 and the ion distribution illustrated in FIG. 9.

The ion distribution illustrated in FIG. 4 and the ion distribution illustrated in FIG. 9 are superimposed by inverting the direction of current through the electromagnets 90 and 91 each time the inversion condition is satisfied. As a result, relatively symmetric ion distribution as illustrated in FIG. 10 is obtained. FIG. 10 illustrates a simulation result of the ion distribution obtained by superimposing the ion distribution illustrated in FIG. 4 and the ion distribution illustrated in FIG. 9.

As described above, with the EUV light generation apparatus 1A according to Embodiment 1, asymmetry of ion reaching sites on the EUV condensation mirror 23 can be reduced. Thus, degradation of symmetry of the condensation pattern (far-field pattern) by the EUV condensation mirror 23 can be reduced to increase a duration in which the exposure performance is maintained.

The EUV condensation mirror 23 is an exemplary "mirror" in the present disclosure.

6. Specific Example of Current Inversion Control

6.1 Main Routine

Figure 11:
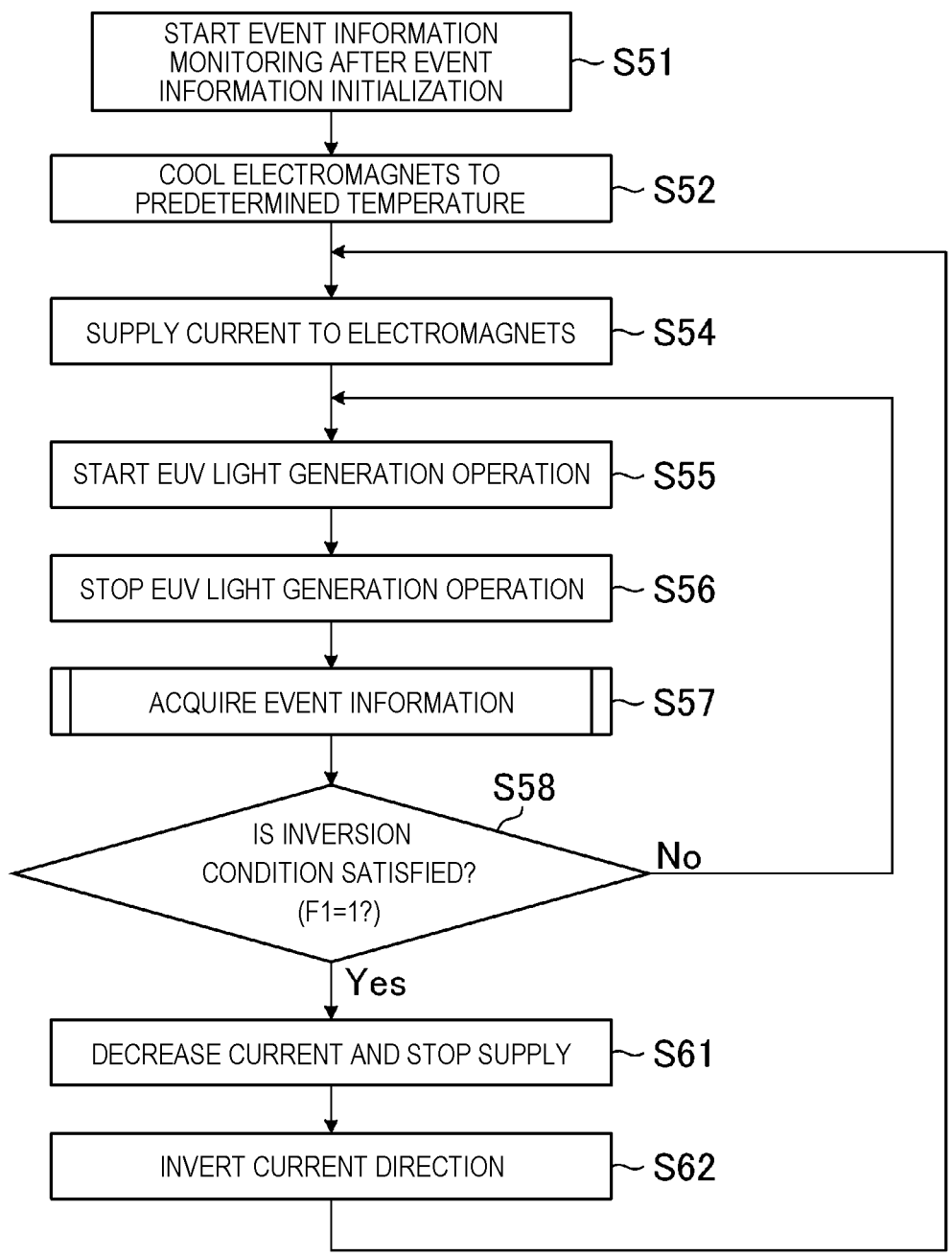
FIG. 11 is a flowchart of a case in which control to invert the direction of current is performed based on event information and an inversion condition.

The following describes a specific example of current inversion control based on the event information and the inversion condition, which is applied in Embodiment 1. FIG. 11 is a flowchart when control to invert the direction of current is performed based on the event information and the inversion condition. Each step illustrated in FIG. 11 may be implemented by the CPU included in the controller 52 through execution of a computer program.

At step S51, the controller 52 initializes the event information and then starts monitoring of the event information.

At step S52, the controller 52 controls the refrigeration device 94 to cool the electromagnets 90 and 91 to a predetermined temperature.

At step S54, the controller 52 controls the current control device 50 to supply current to the electromagnets 90 and 91. The direction of current may be initially set to, for example, the first direction.

At step S55 after a stable magnetic field is formed in the chamber 2, the controller 52 starts EUV light generation operation. The controller 52 generates EUV light in accordance with a command from the exposure apparatus 6. The EUV light generation apparatus 1A may generate the EUV light through a burst operation. Accordingly, the EUV light is supplied from the EUV light generation apparatus 1A to the exposure apparatus 6.

Thereafter at step S56, the controller 52 stops the EUV light generation operation.

At step S57 after step S56, the controller 52 performs event information acquisition processing. Exemplary subroutines of the event information acquisition processing applied to step S57 will be described later. The subroutines applied to step S57 include acquisition of the event information, comparison of the acquired event information with a reference value representing the inversion condition, and determination of the signal value of a flag F1 based on whether the inversion condition is satisfied. In this example, the signal value of the flag F1 is "0" when the inversion condition is not satisfied, and the signal value of the flag F1 is "1" when the inversion condition is satisfied.

Thereafter at step S58, the controller 52 determines whether the inversion condition is satisfied. Specifically, the controller 52 determines whether the signal value of the flag F1 is "1".

When the result of the determination at step S58 is negative, the controller 52 returns to step S55. When the result of the determination at step S58 is positive, in other words, when the inversion condition is satisfied, the controller 52 proceeds to step S61. In addition, the controller 52 may reset the event information when the inversion condition is satisfied.

At step S61, the controller 52 decreases current flowing through the electromagnets 90 and 91 and stops current supply to the electromagnets 90 and 91.

Thereafter at step S62, the controller 52 causes the current inversion device 51 to invert the direction of current. After step S62, the controller 52 proceeds to step S54 and repeats the processing at steps S54 to S62.

When the direction of current before the supply stop at step S61 is the first direction, the direction of current is switched to the second direction opposite to the first direction through step S62.

When the direction of current before the supply stop at step S61 is the second direction, the direction of current is switched to the first direction opposite to the second direction through step S62.

6.2 Exemplary Control Based on the Number of Shots

Figure 12:
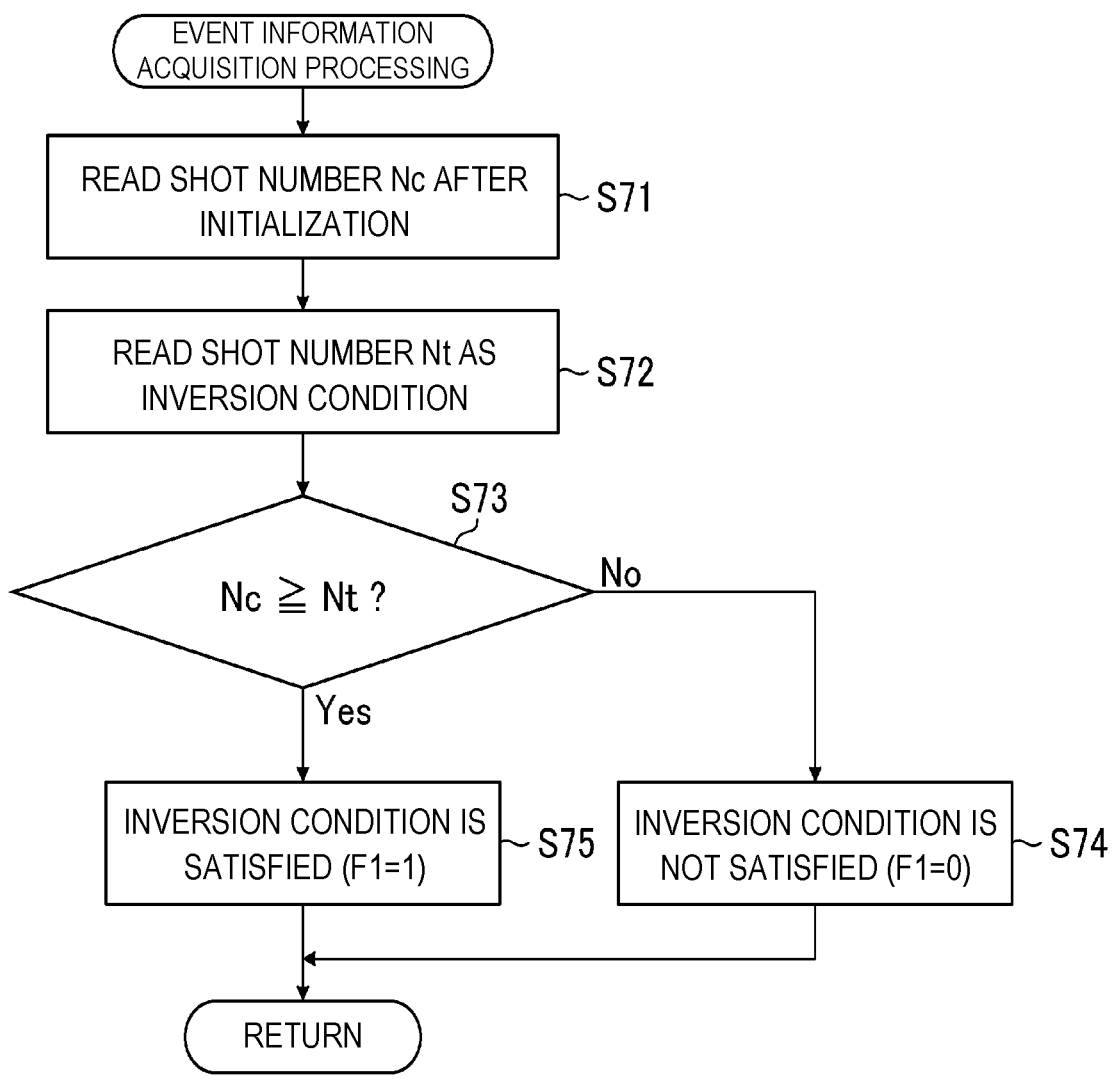
FIG. 12 is a flowchart illustrating first exemplary event information acquisition processing applied to step S57 in FIG. 11.

FIG. 12 is a flowchart illustrating first exemplary event information acquisition processing applied to step S57 in FIG. 11. The flowchart illustrated in FIG. 12 corresponds to an example in which the number of shots is used as the event information.

At step S71, the controller 52 reads a shot number Nc after initialization. The shot number Nc is the number of pulses of EUV light output from the EUV light generation apparatus 1A. Data of the shot number Nc is stored in a memory (not illustrated). The memory may be included in the controller 52 or the EUV light generation control unit 5.

At step S72, the controller 52 reads a shot number Nt as the inversion condition. The shot number Nt as the inversion condition is the determination reference value corresponding to a threshold set in advance. The shot number Nt as the determination reference value is set to be, for example, a shot number with which the degree of reflectance distribution asymmetry of the EUV condensation mirror 23 due to reaching ions reaches a threshold of an allowable range. The shot number Nt may be determined based on experiment or simulation. Data of the shot number Nt is stored in the memory (not illustrated). The shot number Nt is an exemplary "reference value" in the present disclosure.

At step S73, the controller 52 determines whether the relation Nc Nt is satisfied. When the result of the determination at step S73 is negative, the controller 52 proceeds to step S74.

At step S74, the controller 52 determines that the inversion condition is not satisfied, and sets the value of the flag F1 to be "0".

When the result of the determination at step S73 is positive, the controller 52 proceeds to step S75. The result of the determination at step S73 is an exemplary "result of comparison of the index value and the reference value" in the present disclosure.

At step S75, the controller 52 determines that the inversion condition is satisfied, and sets the value of the flag F1 to be "1".

After step S74 or S75, the controller 52 ends the flowchart illustrated in FIG. 12 and returns to the flowchart illustrated in FIG. 11.

6.3 Exemplary Control Based on EUV Energy Cumulated Value

Figure 13:
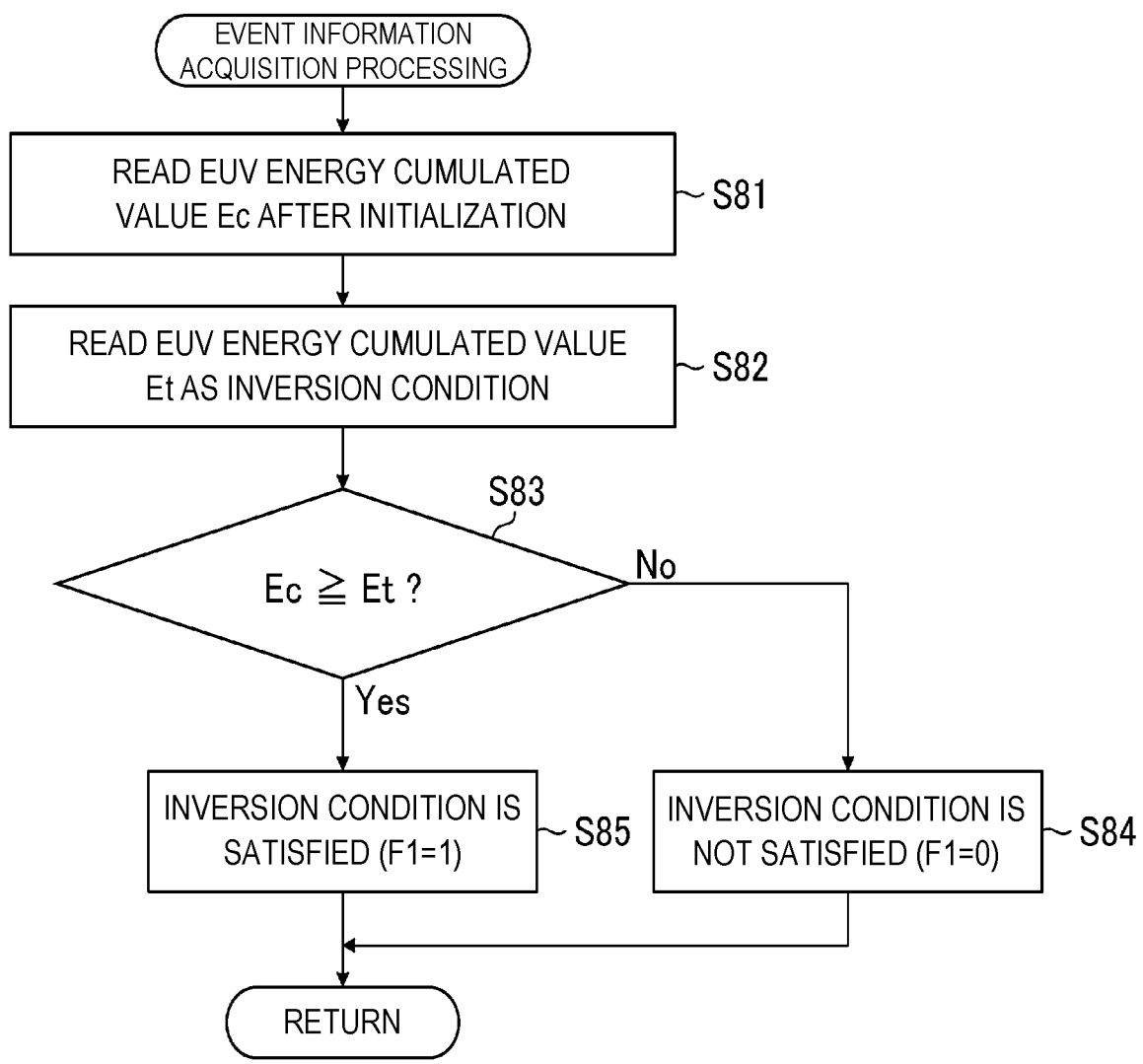
FIG. 13 is a flowchart illustrating second exemplary event information acquisition processing applied to step S57 in FIG. 11.

FIG. 13 is a flowchart illustrating second exemplary event information acquisition processing applied to step S57 in FIG. 11. The flowchart illustrated in FIG. 13 corresponds to an example in which the EUV energy cumulated value is used as the event information.

At step S81, the controller 52 reads an EUV energy cumulated value Ec after initialization. The EUV energy cumulated value Ec is the energy cumulated value of EUV light generated by the EUV light generation apparatus 1A in the far field. Data of the EUV energy cumulated value Ec is stored in the memory (not illustrated). The memory may be included in the controller 52 or the EUV light generation control unit 5.

At step S82, the controller 52 reads an EUV energy cumulated value Et as the inversion condition. The EUV energy cumulated value Et as the inversion condition is the determination reference value corresponding to a threshold set in advance. The EUV energy cumulated value Et as the determination reference value is set to be, for example, an EUV energy cumulated value with which the degree of reflectance distribution asymmetry of the EUV condensation mirror 23 due to reaching ions reaches a threshold of an allowable range. The EUV energy cumulated value Et may be determined based on experiment or simulation. Data of the EUV energy cumulated value Et is stored in the memory (not illustrated). The EUV energy cumulated value Et is an exemplary "reference value" in the present disclosure.

At step S83, the controller 52 determines whether the relation Ec≥Et is satisfied. When the result of the determination at step S83 is negative, the controller 52 proceeds to step S84.

At step S84, the controller 52 determines that the inversion condition is not satisfied, and sets the value of the flag F1 to be "0".

When the result of the determination at step S83 is positive, the controller 52 proceeds to step S85. The result of the determination at step S83 is an exemplary "result of comparison of the index value and the reference value" in the present disclosure.

At step S85, the controller 52 determines that the inversion condition is satisfied, and sets the value of the flag F1 to be "1".

After step S84 or S85, the controller 52 ends the flowchart illustrated in FIG. 13 and returns to the flowchart illustrated in FIG. 11.

6.4 Exemplary Control Based on Symmetry Evaluation Value of Far-Field Pattern

6.4.1 Configuration for Acquiring Far-Field Pattern

Figure 14:
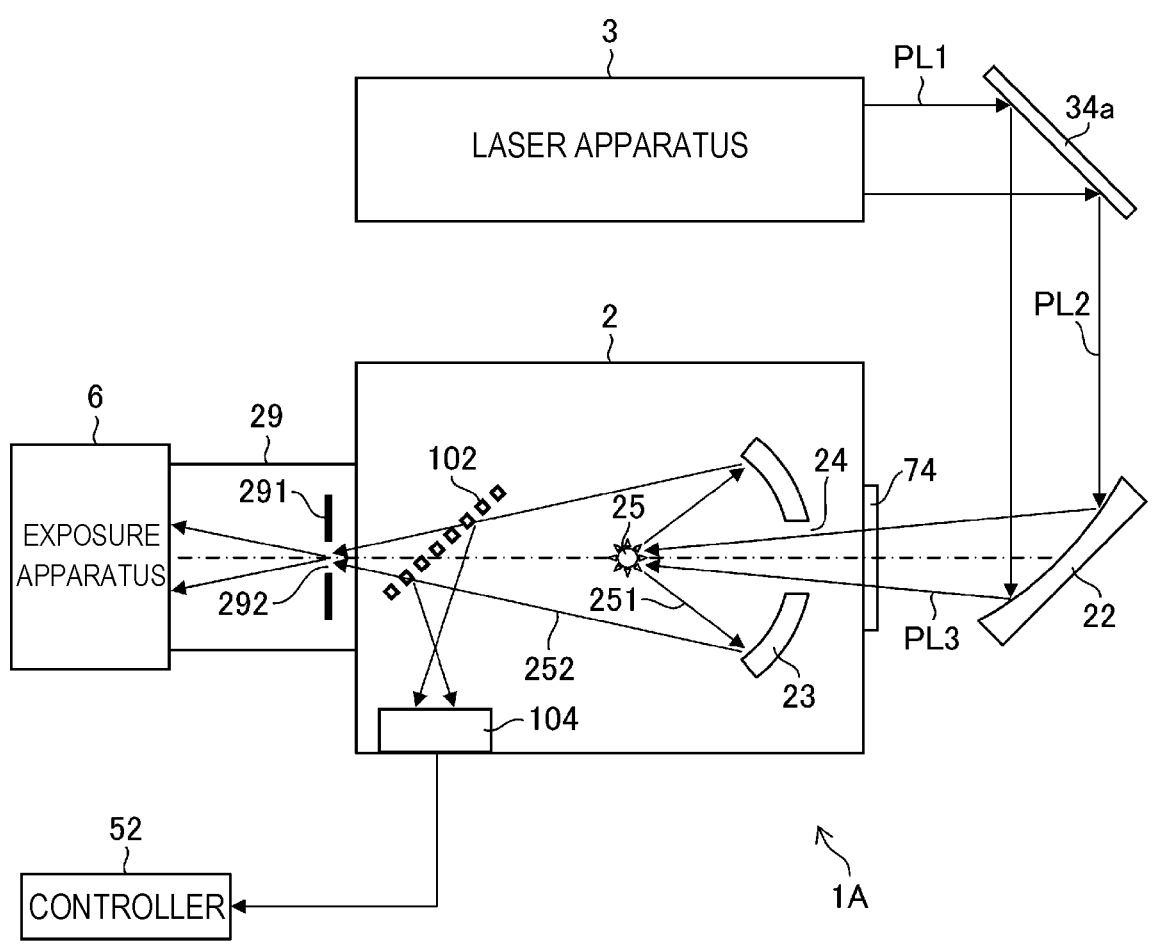
FIG. 14 schematically illustrates the EUV light generation apparatus having a configuration for acquiring a far-field pattern of EUV light.

FIG. 14 schematically illustrates the EUV light generation apparatus 1A having a configuration for acquiring a far-field pattern (FFP) of EUV light. In FIG. 14, a component identical or similar to that described with reference to FIG. 1 is denoted by an identical reference sign, and description thereof will be omitted.

A high reflectance mirror 34a configured to reflect the pulse laser beam PL1 output from the laser apparatus 3 may be included in the beam transmission device 34 described with reference to FIG. 1. The laser beam condensation mirror 22 may be disposed inside the chamber 2.

In the EUV light generation apparatus 1A, the EUV light 252 is emitted at the position of the first focal point of the EUV condensation mirror 23 and imaged at the position of the second focal point (IF). An optical splitting element 102 configured to split the EUV light 252 is disposed on the optical path of the EUV light 252 inside the chamber 2. The optical splitting element 102 may be a grid-type EUV light spectral purity filter (SPF). FIG. 14 illustrates an example in which the optical splitting element 102 is a grid-type EUV light spectral purity filter. The grid-type SPF is disposed between the EUV condensation mirror 23 and the IF.

In addition, an image sensor 104 is disposed on the optical path of light split by the optical splitting element 102. The image sensor 104 detects an FFP image of the light split by the optical splitting element 102 at a position different from the IF position.

6.4.2 Operation

The grid-type SPF is, for example, a square lattice having a pitch interval d and made of a mesh coated with metal or electric conductor. In principle, this grid fully reflects light having a wavelength $\lambda$ satisfying $\lambda \geq 2d$ and transmits light having a wavelength $\lambda$ satisfying $\lambda < 2d$.

In the configuration illustrated in FIG. 14, light having a wavelength of 13.5 nm, which is shorter than a wavelength twice as long as the interval d of the grid, is transmitted and incident on the exposure apparatus 6. In other words, transmission light having transmitted through the optical splitting element 102 is incident on the exposure apparatus 6 through an aperture 293.

However, an actual SPF reflects several % approximately of EUV light of 13.5 nm. Thus, the split light having a wavelength of 13.5 nm in the reflected light is detected on the image sensor 104.

Data of the FFP image detected by the image sensor 104 is output to the controller 52, and a symmetry evaluation value of the far-field pattern is calculated by the controller 52. Symmetry evaluation is same as asymmetry evaluation in effect. The symmetry evaluation value can be regarded as the evaluation value of asymmetry (asymmetry evaluation value).

6.4.3 Modification

In the example illustrated in FIG. 14, an IF image of light having a wavelength of 13.5 nm as EUV light is detected by the image sensor 104, but the present invention is not limited to this example. Another wavelength may be selected, and an IF image of light having the selected wavelength may be used instead.

For example, when the laser apparatus 3 as a driver laser is a $CO_2$ laser (wavelength of 10.6 μm), a $CO_2$ laser beam can be fully reflected by the grid of a grid-type SPF produced with the grid interval d=5.3 μm. The grid can be produced with an aperture ratio of 70% to 90% approximately. A metal part of the grid, in other words, a non-opened part reflects EUV light having a wavelength of 13.5 nm and other light. This reflected light can be used to detect an IF image at the image sensor 104.

6.4.4 Control Flow

Figure 15:
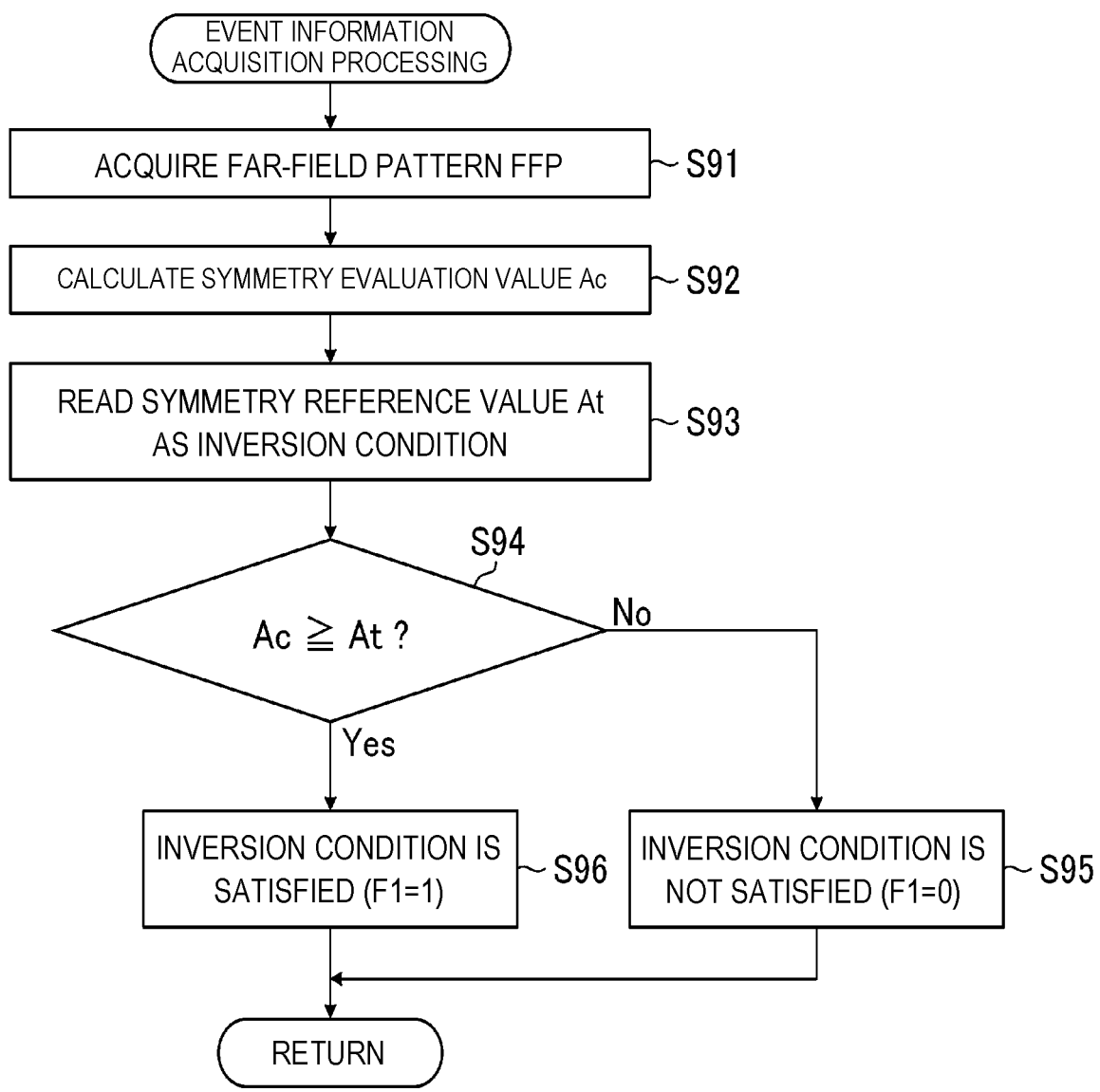
FIG. 15 is a flowchart illustrating third exemplary event information acquisition processing applied to step S57 in FIG. 11.

FIG. 15 is a flowchart illustrating third exemplary event information acquisition processing applied to step S57 in FIG. 11. The flowchart illustrated in FIG. 15 corresponds to an example in which the symmetry evaluation value of the far-field pattern is used as the event information.

At step S91, the controller 52 acquires data of the far-field pattern from the image sensor 104.

At step S92, the controller 52 calculates a symmetry evaluation value Ac from the acquired data of the far-field pattern. The symmetry evaluation value Ac may be determined, for example, through calculation of the absolute value of the difference between an average value Ru of upper half-plane reflectance of the FFP and an average value Rd of lower half-plane reflectance of the FFP: $Ac=|Ru-Rd|$.

At step S93, the controller 52 reads a symmetry reference value At as the inversion condition. The symmetry reference value At as the inversion condition is the determination reference value corresponding to a threshold set in advance. Data of the symmetry reference value At is stored in the memory (not illustrated). The symmetry reference value At is an exemplary "reference value" in the present disclosure.

At step S94, the controller 52 determines whether the relation $Ac \geq At$ is satisfied. When the result of the determination at step S94 is negative, the controller 52 proceeds to step S95.

At step S95, the controller 52 determines that the inversion condition is not satisfied, and sets the value of the flag F1 to be "0".

When the result of the determination at step S94 is positive, the controller 52 proceeds to step S96. The result of the determination at step S94 is an exemplary "result of comparison of the index value and the reference value" in the present disclosure.

At step S96, the controller 52 determines that the inversion condition is satisfied, and sets the value of the flag F1 to be "1".

After step S95 or S96, the controller 52 ends the flowchart illustrated in FIG. 15 and returns to the flowchart illustrated in FIG. 11.

Figure 16:
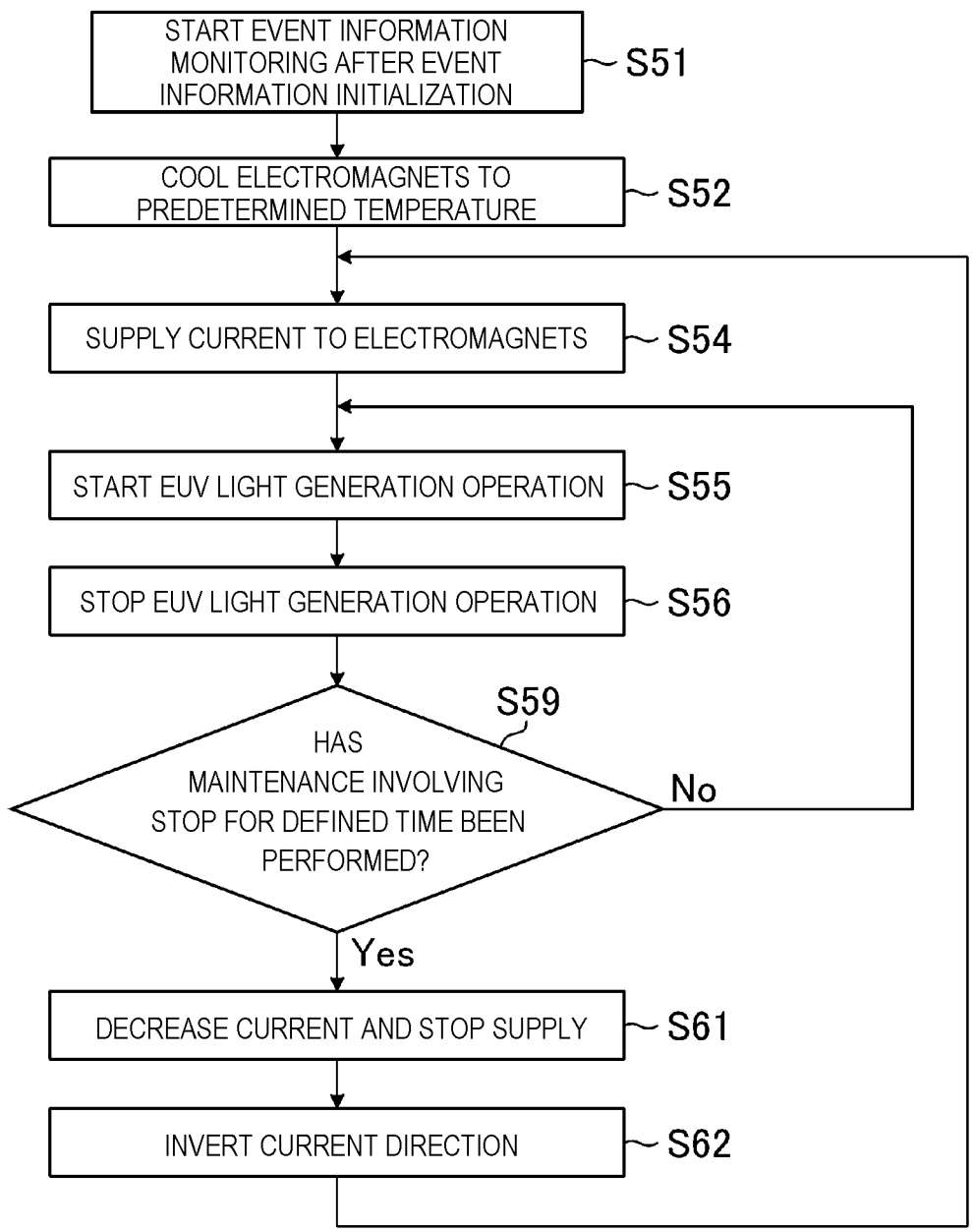
FIG. 16 is a flowchart of a case in which control to invert the direction of current is performed when maintenance involving stop for a defined time is performed.

6.5 Example in which Current Direction is Inverted when Maintenance Involving Stop for Defined Time is Performed FIG. 16 is a flowchart of a case in which control to invert the direction of current is performed when maintenance involving stop for a defined time is performed.

The flowchart illustrated in FIG. 16 is exemplary control when the "event information" is information indicating an execution status of the maintenance involving stop for the defined time and the "inversion condition" is that the maintenance involving stop for the defined time is performed. The defined time is longer than a current rising time of the electromagnets 90 and 91. The current rising time may be a time until a predetermined current value as a target is reached since the start of current flow. The defined time may be, for example, one hour. The "maintenance involving stop for the defined time" is maintenance work that needs operation stop for the defined time or longer. The description "maintenance is performed" conceptually includes "the maintenance is started" and "the maintenance is being performed", and in other words, is "at the timing at which the maintenance is to be performed".

In FIG. 16, a step common to that in FIG. 11 is denoted by an identical step number, and duplicate description thereof will be omitted. The flowchart illustrated in FIG. 16 includes step S59 in place of steps S57 and S58 in FIG. 11.

As illustrated in FIG. 16, after step S56, the controller 52 proceeds to step S59. At step S59, the controller 52 determines whether maintenance involving stop for the defined time has been performed. Information related to the kind or item of the maintenance involving stop for the defined time may be stored in the memory of the controller 52 in advance. For example, the controller 52 sets the signal value of a flag F2 to be "1" when the maintenance involving stop for the defined time is to be performed. The controller 52 performs the determination processing at step S59 based on the signal value of the flag F2.

When the result of the determination at step S59 is negative, the controller 52 returns to step S55. When the result of the determination at step S59 is positive, the controller 52 proceeds to step S61. Processing at any other step is same as that in the flowchart illustrated in FIG. 11.

6.6 Exemplary Control Based on Combination of a Plurality of Conditions

In the inversion condition determination, AND of a plurality of conditions may be used. For example, two or more of the conditions described with reference to FIGS. 12 to 15 may be used in combination. Alternatively, as illustrated in FIG. 17, at least one of the conditions described with reference to FIGS. 12 to 15 and the condition described with reference to FIG. 16 may be used in combination.

Figure 17:
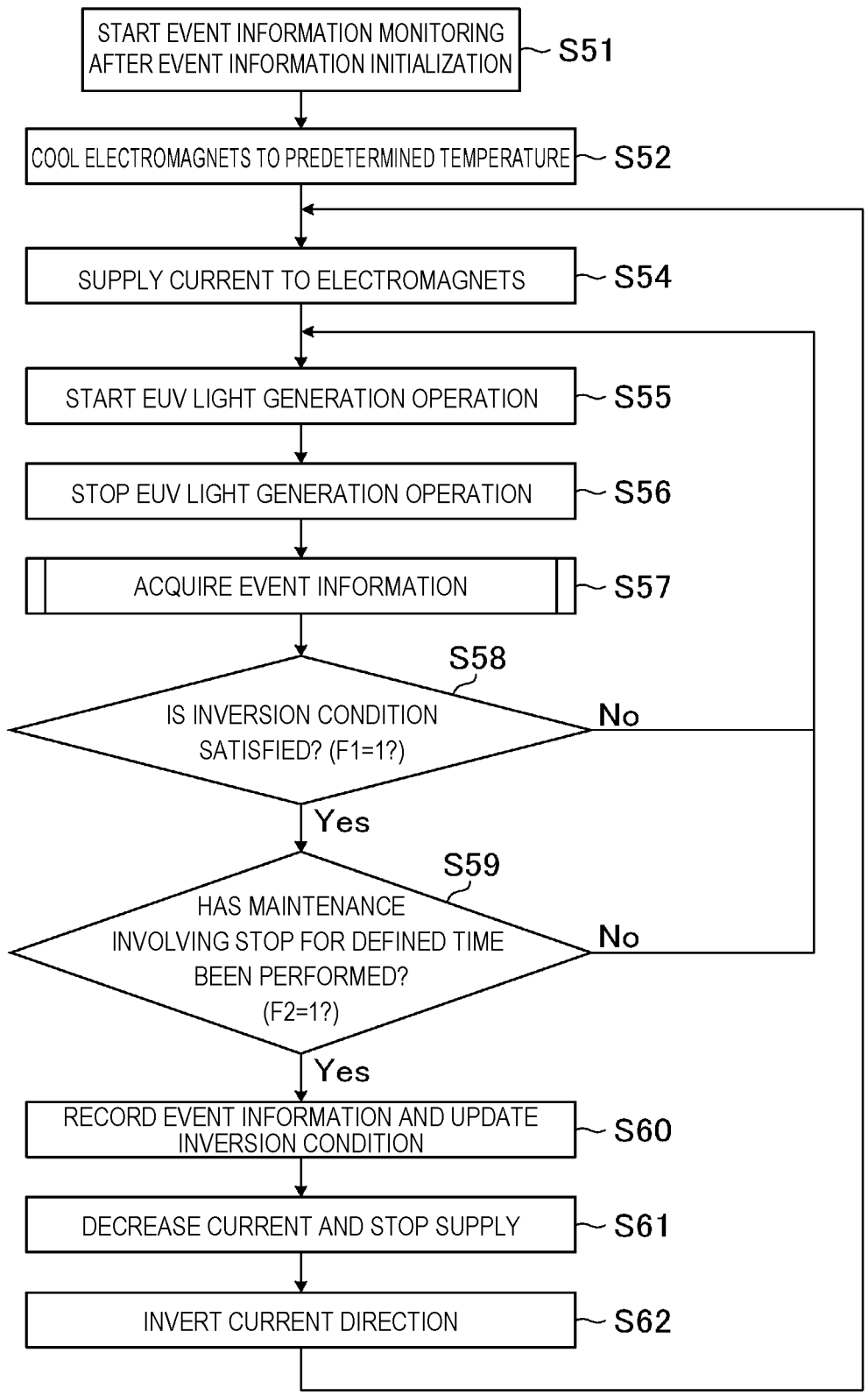
FIG. 17 is a flowchart of a case in which current inversion control is performed through determination of the inversion condition by using AND (logic product) of a plurality of conditions.

FIG. 17 is a flowchart when the current inversion control is performed through the inversion condition determination by using AND of a plurality of conditions. In FIG. 17, a step common to that illustrated in FIGS. 11 and 16 is denoted by an identical step number, and duplicate description thereof will be omitted.

The flowchart illustrated in FIG. 17 includes steps S59 and S60 between steps S58 and S61 in FIG. 11.

When the result of the determination at step S58 in FIG. 17 is negative, the controller 52 returns to step S55. When the result of the determination at step S58 is positive, the controller 52 proceeds to step S59. When the result of the determination at step S59 is negative, the controller 52 returns to step S55. When the result of the determination at step S59 is positive, the controller 52 proceeds to step S60. At step S60, F1=1 and F2=1 are both satisfied. Thus, in the state at step S60, all of the conditions are satisfied.

At step S60, the controller 52 records the current event information and updates the inversion condition. For example, the controller 52 records a shot number Ncm when maintenance involving stop for the defined time or longer is performed. In addition, the controller 52 may update the inversion condition for the next time such that the number of shots from now is equal to or larger than Ncm.

After step S60, the controller 52 proceeds to step S61. Processing at the other steps is same as that of the flowcharts in FIGS. 11 and 16.

The case in which the result of the determination at step S58 is positive and the result of the determination at step S59 is positive in the flowchart illustrated in FIG. 17 is an exemplary case in which it is "determined that all of the conditions are satisfied" in the present disclosure.

6.7 Other Inversion Conditions

The inversion condition is not limited to the above-described examples. The inversion condition is preferably set based on at least one of two viewpoints described below.

At the first viewpoint, the direction of current is inverted before the reflectance distribution of the EUV condensation mirror 23 becomes excessively asymmetric. At the second viewpoint, the stop time of the EUV light generation apparatus 1A is reduced as much as possible.

The inversion condition based on the first viewpoint can be set by using various index values correlated with the degree of asymmetry of the reflectance distribution of the EUV condensation mirror 23 due to ions reaching the EUV condensation mirror 23. For example, the shot number Nc, the EUV energy cumulated value Ec, and the symmetry evaluation value Ac described above are exemplary index values correlated with the degree of asymmetry of the reflectance distribution. In addition, for example, an accumulated use time during which the EUV light generation apparatus 1A is used in an identical current direction can be an index value correlated with the degree of asymmetry of the reflectance distribution. In place of the accumulated use time, the number of days of use and an elapsed time since the start of use may be used as similar index values.

For example, the inversion condition may include a condition that an elapsed time since the EUV light generation apparatus 1A is installed at a semiconductor factory and started being used or an elapsed time since the start of use in a currently set current direction has reached a defined elapsed time. The "elapsed time" may include a stop time during which EUV light emission is stopped. The elapsed time since the start of use in the currently set current direction may be an elapsed time since previous maintenance.

An index value correlated with the degree of asymmetry of the reflectance distribution of the EUV condensation mirror 23 can be used as an index value for asymmetry evaluation. The "evaluation" conceptually includes "prediction" and "estimation". Instead of using such an index value for the evaluation of asymmetry of the reflectance distribution of the EUV condensation mirror 23, the direction of current can be switched at an appropriate timing to improve asymmetry of the reflectance distribution of the EUV condensation mirror 23 as compared to the EUV light generation apparatus 1 according to the comparative example.

The inversion condition based on the second viewpoint can be set by using information related to maintenance execution so that the timing of performing current-direction switching work and the timing of performing other maintenance coincide with each other. Work of switching the direction of current needs a relatively long time, and the EUV light generation apparatus 1A cannot be used during the work. Thus, to reduce the down time, the current-direction switching work is preferably performed at the same timing as the timing of performing maintenance.

The "maintenance" may exclude replacement of the EUV condensation mirror 23. The "same timing" conceptually includes overlapping of at least part of a time during which the current-direction switching work is performed with a time during which other maintenance work is performed, or includes a situation in which these pieces of work are performed continuously in effect although the times do not overlap with each other. The other maintenance work may be started after the current-direction switching work is started, the current-direction switching work may be started after the other maintenance work is started, or both may be simultaneously started.

Figure 18:
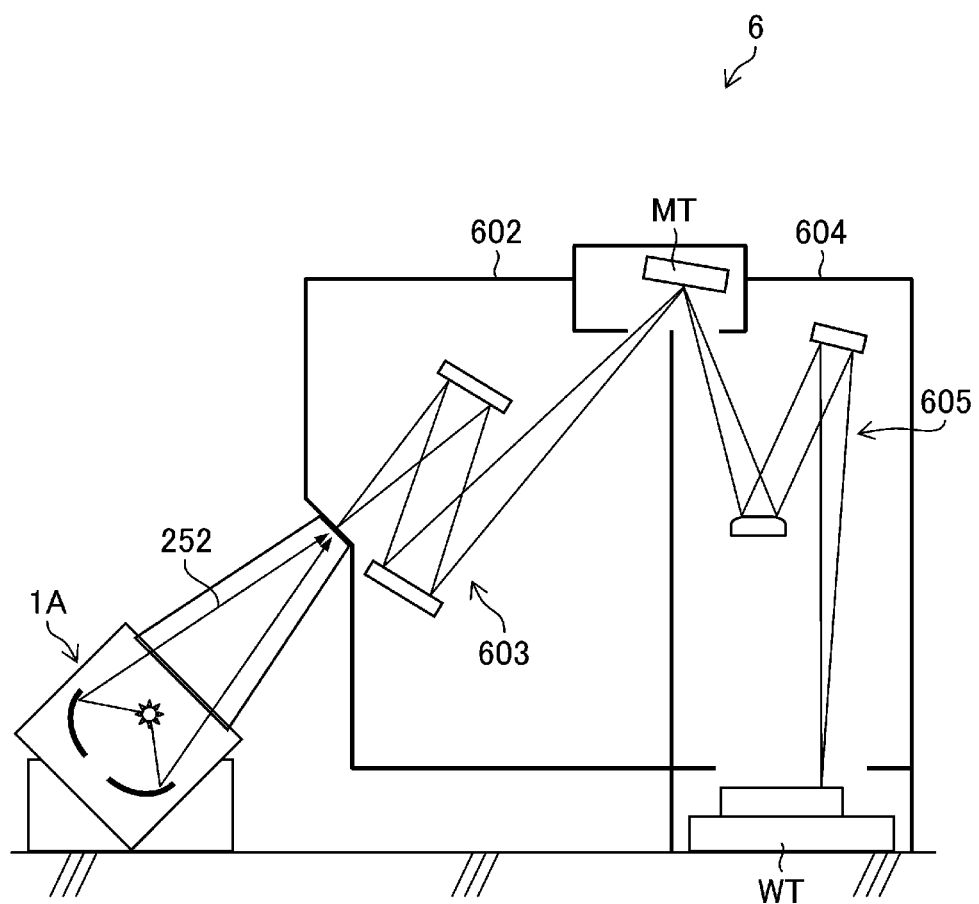
FIG. 18 schematically illustrates the configuration of an exposure apparatus connected with the EUV light generation apparatus.

7. Exemplary Electronic Device Manufacturing Method Using EUV Light Generation Apparatus FIG. 18 schematically illustrates the configuration of the exposure apparatus 6 connected with the EUV light generation apparatus 1A. The exposure apparatus 6 includes a mask irradiation unit 602 and a workpiece irradiation unit 604. The mask irradiation unit 602 illuminates a mask pattern on a mask table MT with the EUV light 252 incident from the EUV light generation apparatus 1A through a reflection optical system 603.

The workpiece irradiation unit 604 causes the EUV light 252 reflected by the mask table MT to image on a workpiece (not illustrated) disposed on a workpiece table WT through a reflection optical system 605.

The workpiece is a photosensitive substrate such as a semiconductor wafer on which photoresist is applied. The exposure apparatus 6 moves the mask table MT and the workpiece table WT in parallel to each other in synchronization to expose the workpiece to EUV light reflected by a mask pattern.

A semiconductor device can be manufactured by transferring a mask pattern onto a semiconductor wafer through the above-described exposure process and then performing a plurality of processes. The semiconductor device is an exemplary "electronic device" in the present disclosure.

The description above is intended to be illustrative and the present disclosure is not limited thereto. Therefore, it would be obvious to those skilled in the art that various modifications to the embodiments of the present disclosure would be possible without departing from the spirit and the scope of the appended claims. Further, it would be also obvious for those skilled in the art that embodiments of the present disclosure would be appropriately combined.

The terms used throughout the present specification and the appended claims should be interpreted as non-limiting terms unless explicitly specified. For example, terms such as "comprise", "include", "have", and "contain" should not be interpreted to be exclusive of other structural elements. Further, indefinite articles "a/an" described in the present specification and the appended claims should be interpreted to mean "at least one" or "one or more". Further, "at least one of A, B, and C" should be interpreted to mean any of A, B, C, A+B, A+C, B+C, and A+B+C as well as to include combinations of the any thereof and any other than A, B, and C.

What is claimed is:

1. An extreme ultraviolet light generation device comprising:
    a chamber;
    a mirror configured to condense extreme ultraviolet light radiated from plasma generated by irradiating a target supplied into the chamber with a laser beam;
    an electromagnet disposed outside the chamber to form a magnetic field between a generation region of the plasma in the chamber and the mirror;
    a current inversion device configured to invert a direction of current flowing through the electromagnet; and
    a controller configured to control the current inversion device to invert the direction of the current when a set condition is satisfied.

2. The extreme ultraviolet light generation device according to claim 1, wherein the controller acquires event information to be used for determination of the condition and determines whether to invert the direction of the current based on the event information.

3. The extreme ultraviolet light generation device according to claim 1, wherein the condition includes at least one of a condition that a timing of performing maintenance has been reached, a condition that the number of times of maintenance performed has reached a defined number of times, a condition that the number of shots of the extreme ultraviolet light has reached a defined number of shots, a condition that an energy cumulated value of the extreme ultraviolet light has reached a defined energy cumulated value, and a condition that an elapsed time since start of use of the extreme ultraviolet light generation device or an elapsed time since start of use in a currently set direction of the current has reached a defined elapsed time.

4. The extreme ultraviolet light generation device according to claim 1, wherein the condition includes a condition that a timing of performing maintenance requiring a work time equal to or longer than a defined time has been reached.

5. The extreme ultraviolet light generation device according to claim 4, wherein the defined time is one hour.

6. The extreme ultraviolet light generation device according to claim 4, wherein the defined time is a current rising time of the electromagnet.

7. The extreme ultraviolet light generation device according to claim 1, wherein the condition includes a condition that an index value for evaluating asymmetry of reflectance distribution of the mirror due to ions generated along with the generation of the plasma reaching the mirror exceeds a reference value.

8. The extreme ultraviolet light generation device according to claim 7, wherein the controller acquires the index value and determines whether to invert the direction of the current based on a result of comparison of the index value and the reference value.

9. The extreme ultraviolet light generation device according to claim 7, wherein the index value includes at least one of the number of shots of the extreme ultraviolet light, an energy cumulated value of the extreme ultraviolet light, and a symmetry evaluation value for evaluating symmetry of a far-field pattern of the extreme ultraviolet light by the mirror.

10. The extreme ultraviolet light generation device according to claim 7, further comprising:
    an optical splitting element disposed on an optical path of the extreme ultraviolet light reflected by the mirror and configured to split the extreme ultraviolet light; and
    a sensor configured to detect a far-field pattern image of the extreme ultraviolet light split by the optical splitting element,
    wherein the controller calculates, as the index value, a symmetry evaluation value for evaluating symmetry of a far-field pattern of the extreme ultraviolet light by the mirror based on data of the far-field pattern image acquired through the sensor.

11. The extreme ultraviolet light generation device according to claim 1, wherein
    a plurality of conditions are set as the condition, and
    the controller inverts the direction of the current when it is determined that all of the conditions are satisfied.

12. The extreme ultraviolet light generation device according to claim 11, wherein a condition that a timing of performing maintenance requiring a work time equal to or longer than a defined time has been reached is included as one of the conditions.

13. The extreme ultraviolet light generation device according to claim 1, wherein
a plurality of conditions are set as the condition, and
the controller inverts the direction of the current when it is determined that at least one of the conditions is satisfied.

14. The extreme ultraviolet light generation device according to claim 1, wherein
the electromagnet includes two coils disposed on respective sides of the mirror, and
the controller sets the directions of current flowing through the two coils to be identical to each other.

15. The extreme ultraviolet light generation device according to claim 14, wherein the two coils form a mirror magnetic field around the generation region of the plasma.

16. The extreme ultraviolet light generation device according to claim 1, wherein the electromagnet is a superconductive magnet.

17. The extreme ultraviolet light generation device according to claim 1, further comprising:
a gas supply unit configured to supply etching gas into the chamber;
a discharge port as an opening provided to a wall surface of the chamber;
a discharge pipe connected with the discharge port; and
a discharge device connected with the discharge pipe and configured to discharge gas containing the etching gas from inside of the chamber to outside of the chamber.

18. The extreme ultraviolet light generation device according to claim 17, wherein the discharge port is provided at a position where a central axis of the magnetic field formed by the electromagnet traverses an inner wall of the chamber.

19. The extreme ultraviolet light generation device according to claim 1, wherein
the mirror has a spheroidal reflective surface and is disposed such that a first focal point of the mirror is positioned in the generation region of the plasma and a second focal point of the mirror is positioned at an intermediate focal point, and
a central axis of the magnetic field is orthogonal to an optical path axis passing through the first focal point and the second focal point of the mirror.

20. An electronic device manufacturing method comprising:
generating extreme ultraviolet light by using an extreme ultraviolet light generation device including
a chamber,
a mirror configured to condense the extreme ultraviolet light radiated from plasma generated by irradiating a target supplied into the chamber with a laser beam,
an electromagnet disposed outside the chamber to form a magnetic field between a generation region of the plasma in the chamber and the mirror,
a current inversion device configured to invert a direction of current flowing through the electromagnet, and
a controller configured to control the current inversion device to invert the direction of the current when a set condition is satisfied;
outputting the extreme ultraviolet light to an exposure apparatus; and
exposing a photosensitive substrate to the extreme ultraviolet light in the exposure apparatus to manufacture an electronic device.

\* \* \* \* \*